United States Patent
Mandelman et al.

(10) Patent No.: US 7,390,730 B2
(45) Date of Patent: Jun. 24, 2008

(54) METHOD OF FABRICATING A BODY CAPACITOR FOR SOI MEMORY

(75) Inventors: Jack A. Mandelman, Flat Rock, NC (US); Louis C. Hsu, Fishkill, NY (US); Rajiv V. Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/742,147

(22) Filed: Apr. 30, 2007

(65) Prior Publication Data
US 2007/0202637 A1 Aug. 30, 2007

Related U.S. Application Data

(62) Division of application No. 11/064,730, filed on Feb. 24, 2005, now Pat. No. 7,232,745.

(51) Int. Cl.
*H01L 21/3205* (2006.01)
*H01L 21/4763* (2006.01)

(52) U.S. Cl. .................... 438/593; 438/244; 257/68

(58) Field of Classification Search .............. 438/244, 438/296, 386, 593; 257/68, 296, 301, 305
See application file for complete search history.

(56) References Cited

U.S. PATENT DOCUMENTS

| | | | |
|---|---|---|---|
| 6,048,767 A * | 4/2000 | Terada | 438/262 |
| 6,284,594 B1 | 9/2001 | Ju et al. | |
| 6,300,243 B1 | 10/2001 | Thakur | |
| 7,183,611 B2 * | 2/2007 | Bhattacharyya | 257/347 |

\* cited by examiner

*Primary Examiner*—Phuc T Dang
(74) *Attorney, Agent, or Firm*—Scully, Scott, Murphy & Presser, P.C.; Brian Verminski

(57) ABSTRACT

A semiconductor structure having a body capacitance plate, which is formed with a process that assures that the body capacitance plate is self-aligned to both the source line (SL) diffusion and the bitline diffusion is provided. Thus the amount of overlap between the SL and the bitline diffusions and the body capacitance plate is precisely controlled. More specifically, the present invention forms the structure of a 1T-capacitorless SOI body charge storage cell having sidewall capacitor plates using a process that assures that there is 1) minimal overlap between plate and source/drain diffusions, and 2) that the minimal overlap obtained in the present invention is precisely controlled and is not subject to alignment tolerances. The inventive cell results in larger signal margin, improved performance, smaller chip size, and reduced dynamic power dissipation relative to the prior art.

10 Claims, 33 Drawing Sheets

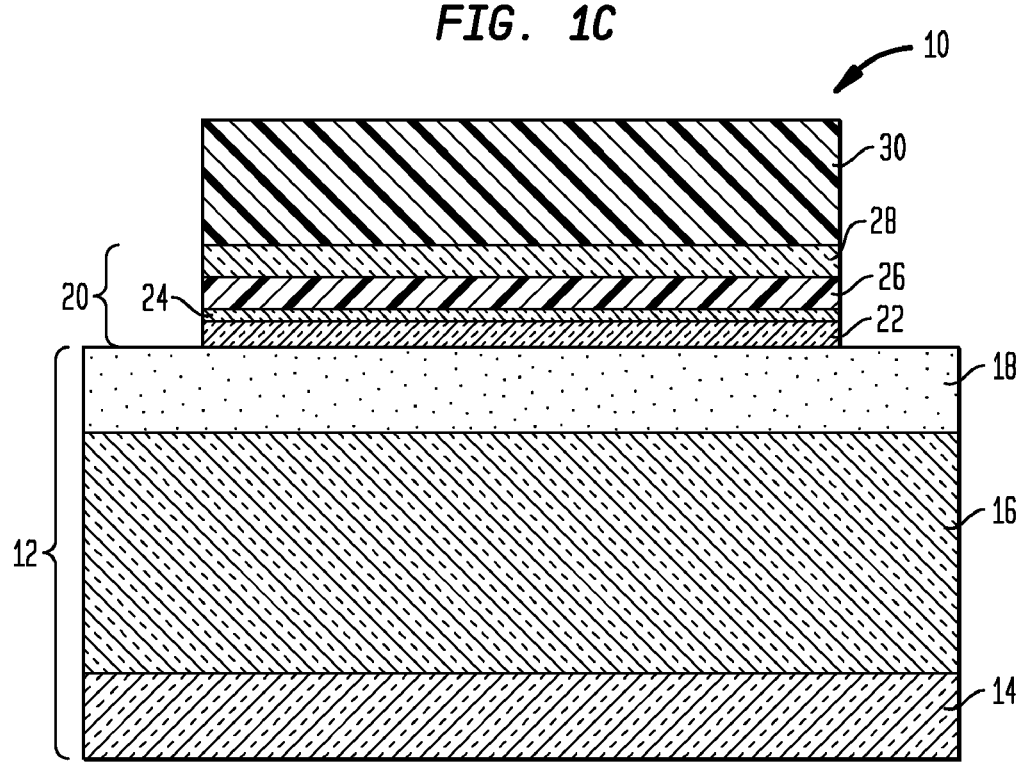
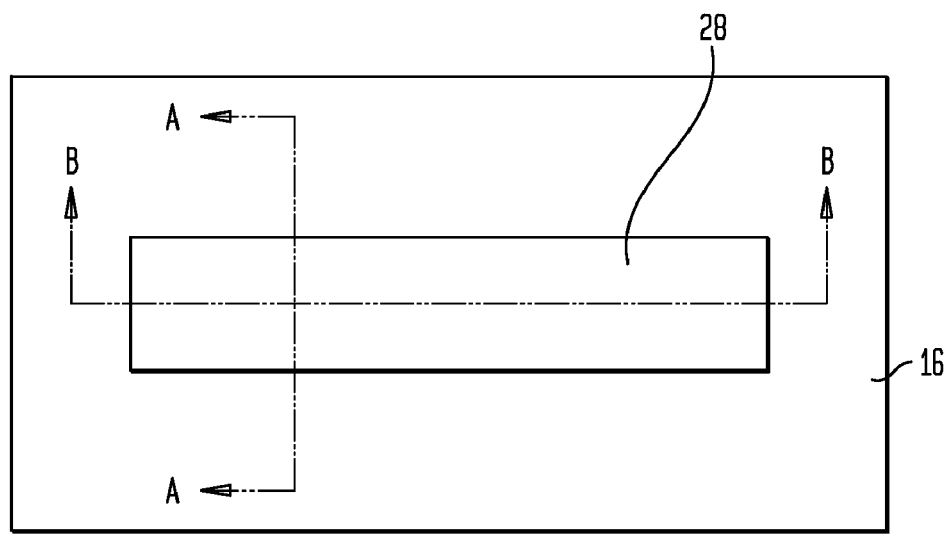

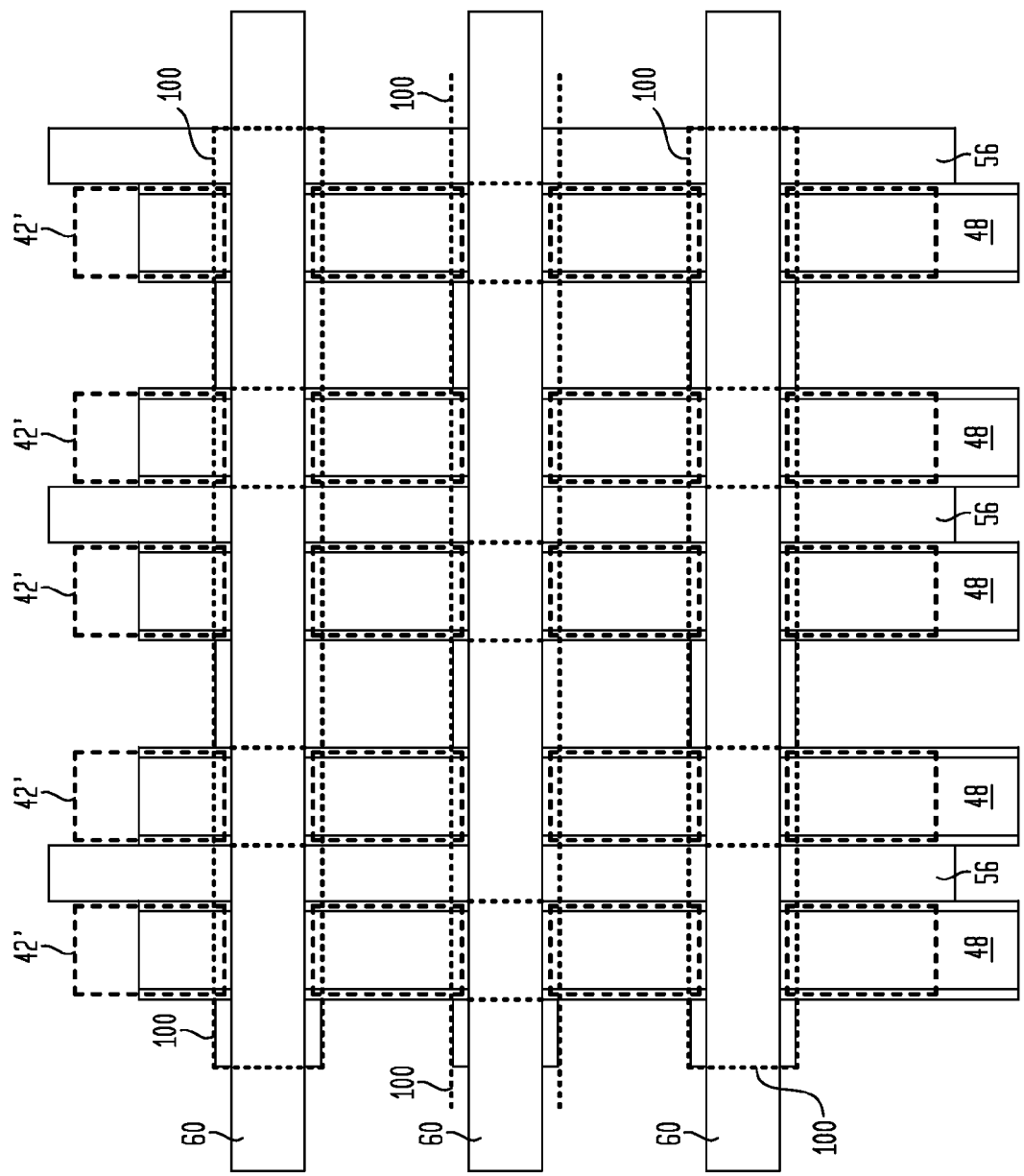

METHOD OF FABRICATING A BODY CAPACITOR FOR SOI MEMORY

RELATED APPLICATIONS

This application is a divisional application of U.S. Ser. No. 11/064,730, filed Feb. 24, 2005, now U.S. Pat. No. 7,232,745.

FIELD OF THE INVENTION

The present invention relates to a semiconductor structure and a method of fabricating the same. More particularly, the present invention relates to a body capacitor for a silicon-on-insulator (SOI) memory device. The present invention also provides a method for fabricating such a semiconductor structure in which the processing steps assure that there is minimal overlap capacitance between the capacitor plate and the source/drain diffusions that is controlled and is not subjected to alignment tolerances. The present invention also relates to a semiconductor memory cell layout that includes the inventive SOI body capacitor used in a folded bitline design.

BACKGROUND OF THE INVENTION

Several one transistor (1T)-capacitorless cells that store charge in the body of a silicon-on-insulator (SOI) metal oxide semiconductor field effect transistor (MOSFET) are known in the art. Both the Fazan cell (See, for example, IEEE Electron Device Letters, Vol. 23, No. 2, February 2002) and the Toshiba cell (See, for example, IEEE Journal of Solid-State Circuits, Vol. 37, No. 11, November 2002) are examples of such cells.

The Toshiba cell improves upon the Fazan cell by enhancing the body capacitance with a conducting plate coupled to the sidewall of the SOI layer through a dielectric. The plate is connected to the substrate through the buried oxide (BOX) of the SOI. Although the Toshiba cell results in enhanced body charge, and improves the distinction between a "0" (minimum quantity of body majority carriers) and a "1" (maximum accumulation of majority carriers), due to alignment tolerances the amount of overlap between the plate-bitline diffusion and plate-source diffusion varies randomly from cell to cell, and across the chip. This random variation in overlap adds a parasitic capacitance that increases the average bitline capacitance. This increased bitline capacitance results in a combination of slower performance, increased chip area (because larger drivers are required to compensate for the larger parasitic capacitance), and increased dynamic power dissipation.

In view of the above drawbacks with prior art 1T-capacitorless cells, there is a need to provide such as cell that avoids excessive overlap of the body capacitor plate with the bitline diffusion.

SUMMARY OF THE INVENTION

The present invention provides a semiconductor structure having a body capacitor plate, which is formed with a process that assures that the body capacitor plate is self-aligned to both the source line (SL) diffusion and the bitline (BL) diffusion. Thus, the amount of overlap between the SL and the BL diffusions and the body capacitor plate is precisely controlled. Unlike the Toshiba cell, the inventive 1-T dynamic access memory (DRAM) cell minimizes the body-capacitor overlap capacitances among source and drain junctions and provides coupling nearly exclusively to the body regions to effectively hold the body charges.

More specifically, the present invention forms the structure of a 1 T-capacitorless SOI body charge storage cell having sidewall capacitor plates using a process that assures that there is 1) minimal overlap between plate and source/drain diffusions, and 2) that the minimal overlap obtained in the present invention is precisely controlled and is not subject to alignment tolerances. The inventive cell results in larger signal margin, improved performance, smaller chip size, and reduced dynamic power dissipation relative to the prior art.

In broad terms, the semiconductor structure of the present invention comprises a silicon-on-insulator substrate comprising an upper patterned Si-containing layer located atop a buried insulating layer, said patterned Si-containing layer having source/drain diffusions located therein;

a plurality of transistors, each including a wordline gate conductor, located on a surface of said patterned Si-containing layer, wherein a bitline stud which extends to an overlaying bitline is in contact with one of said source/drain diffusions;

a source line located atop said patterned Si-containing layer adjacent to selected transistors, said source line is in contact with another of said source/drain diffusions; and a capacitor plate beneath each wordline gate conductor and located within said patterned Si-containing layer and extending down through said buried insulating layer, wherein said source/drain diffusions, said wordline gate conductor and said capacitor plate have edges that are aligned to each other.

In the present invention, the source line (SL) is present atop one of the source/drain diffusions of a transistor and thus that diffusion region can be referred to as the SL diffusion. Also, the other diffusion region of the transistor is in contact with the bitline (BL) through the bitline stud and thus it can be referred to herein as the BL diffusion.

In addition to the semiconductor structure described above, the present invention also provides a method of fabricating the same. Specifically, and in broad terms, the method of the present invention comprises:

providing a structure that includes a patterned material stack located atop a patterned Si-containing layer, said patterned Si-containing layer is located on a buried insulating layer of a silicon-on-insulator substrate;

forming a dielectric on exposed sidewalls of at least said patterned Si-containing layer;

forming isolation regions on exposed areas of said buried insulating layer that lie adjacent to said patterned Si-containing layer;

providing a recess in a portion of said isolation regions through said buried insulating layer and forming a sidewall capacitor plate in said recess;

forming a plurality of transistors on said patterned Si-containing layer, each transistor comprising a wordline gate conductor and underlying source/drain diffusions; and forming a source line atop one of said diffusions and forming a bitline stud and a bitline atop said other diffusion, wherein said bitline stud separates a pair of adjacent wordline gate conductors, and said source/drain diffusions, said wordline gate conductor and said capacitor plate have edges that are aligned to each other.

The present invention also relates to a memory cell layout that comprises an array of memory cells, each memory cell comprising a plurality of transistors, each including a wordline gate conductor, located on a surface of a patterned Si-containing layer of a silicon-on-insulator substrate, wherein a bitline stud which extends to an overlaying bitline is in contact with one of said source/drain diffusions;

a source line located atop said patterned Si-containing layer adjacent to each transistor, said source line is in contact with another of said source/drain diffusions; and a capacitor plate beneath each wordline gate conductor and located within said patterned Si-containing layer and extending down through an underlying buried insulating layer, wherein said source/drain diffusions, said wordline gate conductor and said capacitor plate have edges that are aligned to each other, and each wordline gate conductor gates a cell in alternate crossing bitlines.

BRIEF DESCRIPTION OF THE DRAWING

FIG. 22 is a second exemplary layout of a portion of an array cell employing the inventive self-aligned SOI body capacitor.

DETAILED DESCRIPTION OF THE INVENTION

Figure 1A:
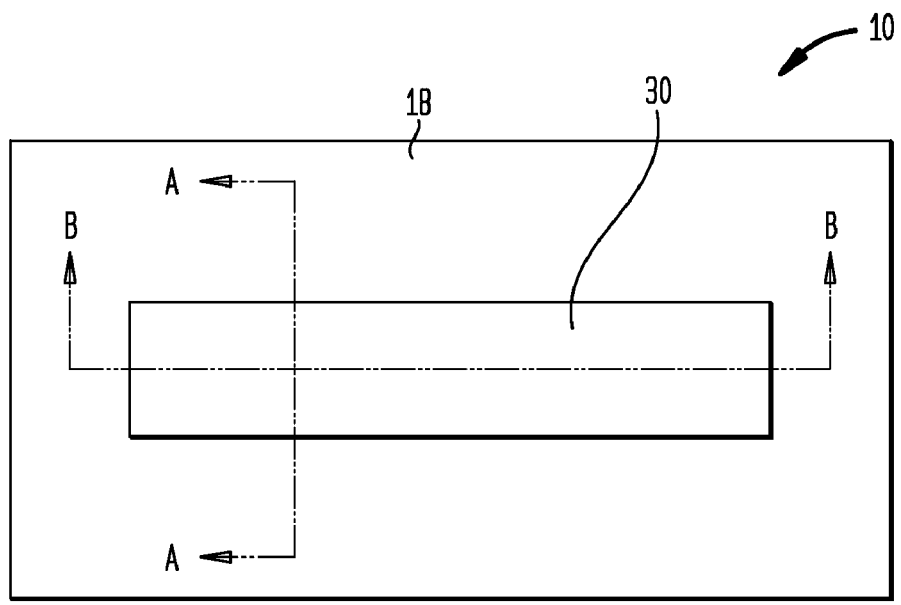
FIGS. 1-20 are pictorial representation (through various views) illustrating the various processing steps that are employed the present invention for fabricating a self-aligned SOI body capacitor structure.

The present invention, which provides a self-aligned SOI body capacitor and a method of fabricating the same, will now be described in greater detail by referring to the drawings that accompany the present application. The drawings are provided herein for illustrative purposes and thus they are not drawn to scale.

In FIGS. 1-20, the structure through various processing steps is illustrated in different views. Drawing A represents a top-down view where cross sections A-A and B-B, and in some instances C-C, are shown. Drawing B is a cross sectional view along the line A-A, Drawing C is a cross sectional view along the line B-B, and Drawing D is a cross sectional view along the line C-C. "A-A" is a cross section in a vertical cutting a plane parallel to a wordline location, and through the center of the wordline location. " B-B" is a cross section in a vertical cutting plane parallel to a bitline location, and through the center of the bitline location. "C-C" is a cross section in a vertical cutting plane parallel to a bitline location, and through a capacitor plate.

Figure 1B:
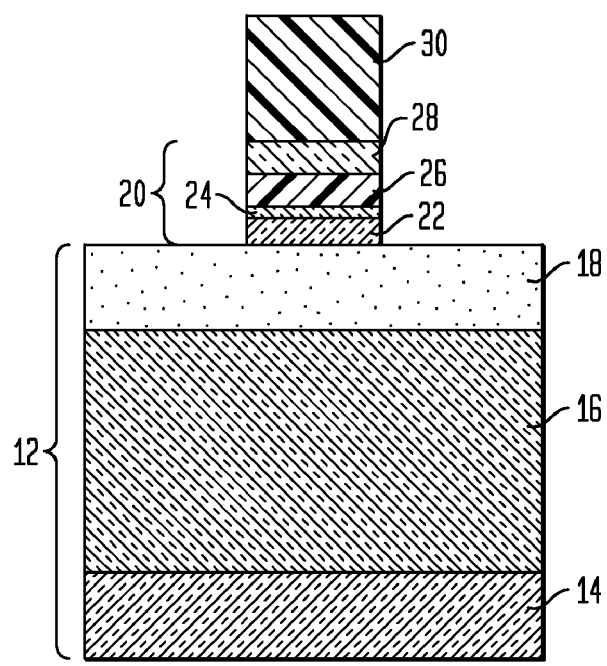

The process of fabricating a self-aligned SOI body capacitor begins by first providing the structure 10 shown in FIG. 1A-1C. The structure 10 includes a Si-on-insulator (SOI) substrate 12, a patterned material stack 20 located on an upper surface of the SOI substrate 12 and a patterned resist 30 located on an upper surface of the patterned material stack 20.

The SOI substrate 12 includes a semiconductor layer 14, a buried insulating layer 16 and a Si-containing layer 18. The semiconductor layer 14 of the SOI substrate 12 comprises any semiconductor material known in the art. Illustrative examples of semiconductor materials that can be employed as the semiconductor layer 14 include, but are not limited to: Si, SiC, SiGe, SiGeC, Ge alloys, GaAs, InAs, InP as well as other III/V or II/VI compound semiconductors. Typically, the semiconductor layer 14 is a Si-containing semiconductor such as, Si, SiC, SiGe, or SiGeC. The thickness of the semiconductor layer 14 is inconsequential to the present invention.

The buried insulating layer 16 is typically comprised of an oxide, nitride, oxynitride or multilayers thereof. More typically, the buried insulating layer, 16 is comprised of an oxide. The thickness of the buried insulating layer 16 may vary depending on the origin of the layer. Typically, however, the buried insulating layer 16 has a thickness from about 5 to about 500 nm, with a thickness from about 50 to about 200 nm being more highly preferred.

The Si-containing layer 18 of the SOI substrate 12 is comprised of a silicon containing semiconductor including, for example, Si, SiC, SiGe, or SiGeC. The Si-containing layer 18 of the SOI substrate 12 is preferably monocrystalline. The thickness of the Si-containing layer 18 may vary depending on the technique that was used in forming the SOI substrate 12. Typically, the Si-containing layer 18 of the SOI substrate 12 has a thickness from about 2 to about 300 nm, with a thickness from about 5 to about 150 nm being more highly preferred.

The crystal orientation of the semiconductor layer 14 and the Si-containing layer 18 may be the same or different, with the same crystal orientation being typical for SOI substrates made by separation of silicon by ion implantation of oxygen (SIMOX). Illustratively, the crystal orientation of layers 14 and 18 are typically chosen from (100), (110) or (111). The Si-containing layer 18 of the SOI substrate 12 can be unstrained, strained or a combination thereof The SOI substrate 12 shown in FIGS. 1A-1C can be fabricated using techniques that are well known in the art. For example the SOI substrate 12 may be formed by an ion implantation process referred to as SIMOX in which ions such as oxygen ions are implanted into a starting wafer and thereafter the ion implanted wafer is subjected to an annealing process that causes the formation of the buried insulating layer 16 within the substrate. Alternatively, the SOI substrate 12 can be formed by a layer transfer process that includes wafer bonding.

The patterned material stack 20 shown in FIGS. 1A-1C comprises at least three layers, with a fourth layer being optional. The bottom most layer of material stack 20 is a nitride layer 22. An optional oxide marker layer 24 may be located on the nitride layer 22. The purpose of using the optional oxide marker layer 24 will be discussed in relation to FIGS. 10A-10C. A polysilicon layer 26 may be located on the oxide marker layer 24, if present, or on the nitride layer 22. The uppermost layer of the material stack 20 comprises a nitride layer 28.

The thickness of the patterned material stack 20 may vary depending on the number of layers within the stack. Typically, the overall thickness of the patterned material stack 20 is from about 20 to about 600 nm, with a thickness from about 35 to about 300 nm being more typically. This overall thickness for the patterned material stack 20 includes a thickness for the nitride layer 22 from about 5 to about 200, preferably from about 10 to about 100, nm, a thickness for the optional oxide marker layer 24 from about 3 to about 10, preferably, from about 4 to about 8, nm, a thickness for the polysilicon layer 26 from about 5 to about 200, preferably from about 10 to about 100, nm, and a thickness for the nitride layer 28 from about 5 to about 200, preferably from about 10 to about 100, nm.

The patterned resist 30 is comprised of a conventional photoresist material and its thickness is well known to those skilled in the art.

The patterned material stack 20 is formed by first forming the various material layers using one or more conventional blanket deposition techniques such as, for example, chemical vapor deposition (CVD), plasma enhanced chemical vapor deposition (PECVD), evaporation, chemical solution deposition, or atomic layer deposition. The polysilicon layer 26 can be formed by a CVD process. In addition to deposition processes, the various insulating layers of the material stack 20 can be formed by thermal means including oxidation and nitridation. A combination of the aforementioned techniques can also be used.

After forming the various layers of the material stack, a resist is applied to the uppermost layer of the material stack 20 utilizing a conventional deposition process such as, for example, spin-on coating, and then the resist is subjected to a conventional lithographic process. The lithographic process includes exposing the resist material to a pattern of radiation and developing the resist utilizing a conventional developer. After the resist has been patterned, the pattern is transferred into the material stack, stopping on the upper surface of the SOI substrate 12, i.e., on top of the Si-containing layer 18, utilizing one or more, preferably one, etching process. The etching process used to pattern the material stack includes a dry etching process (including reactive ion etching, ion beam etching, plasma etching or laser ablation), wet etching, or a combination thereof. Preferably, the etching used to pattern the material stack comprises anisotropic reactive ion etching wherein the chemistry of the etchant is changed to selectively etch the exposed material layer. The patterned resist 30 can, in some embodiments, be removed from the structure following the formation of the patterned material 20 utilizing a conventional resist stripping process.

Prior to forming the material stack on the SOI substrate, a pre-implant step is performed in which ions (n- or p- type) are implanted through the Si-containing layer 18 and the buried insulating layer 16 stopping within the upper surface of the semiconductor layer 14. That is, a heavily doped (on the order of about $1 \times 10^{19}$ atoms/cm$^3$ or greater) region (not shown in the drawings) can be formed at or near the interface between the buried insulating layer 16 and the semiconductor layer 14. The dopant polarity of the heavily doped region is selected to be the same as the dopant polarity of the polysilicon body capacitor sidewall plate, to be subsequently formed and contacted to the substrate. This heavily doped region in the semiconductor layer 14 beneath the buried insulating layer 16 will serve to distribute the voltage that is applied to the sidewall plates, by enhancing conduction near the semiconductor layer 14/buried insulating layer 16 interface.

Note that in FIGS. 1A-1C the patterned material stack 20 protects portions of the Si-containing layer 18, while leaving other portions of the Si-containing layer 18 exposed. Also, the patterned material stack 20 defines (i.e., covers) the active region in which the transistor of the inventive structure will be subsequently formed. The optional oxide maker layer 24 is shown in FIGS. 1A-1C and is not shown again in the remaining drawings.

Figure 2B:
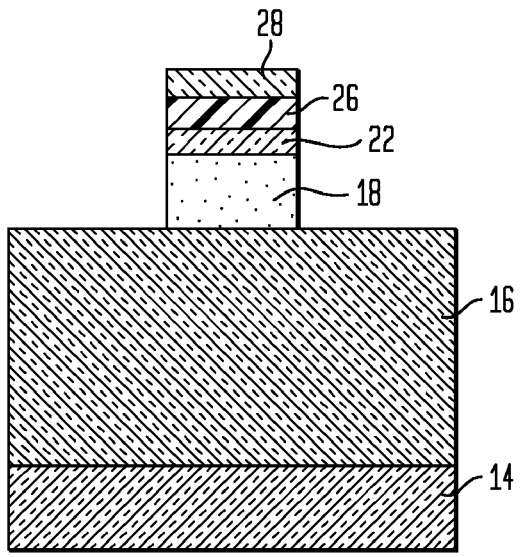
Figure 2C:
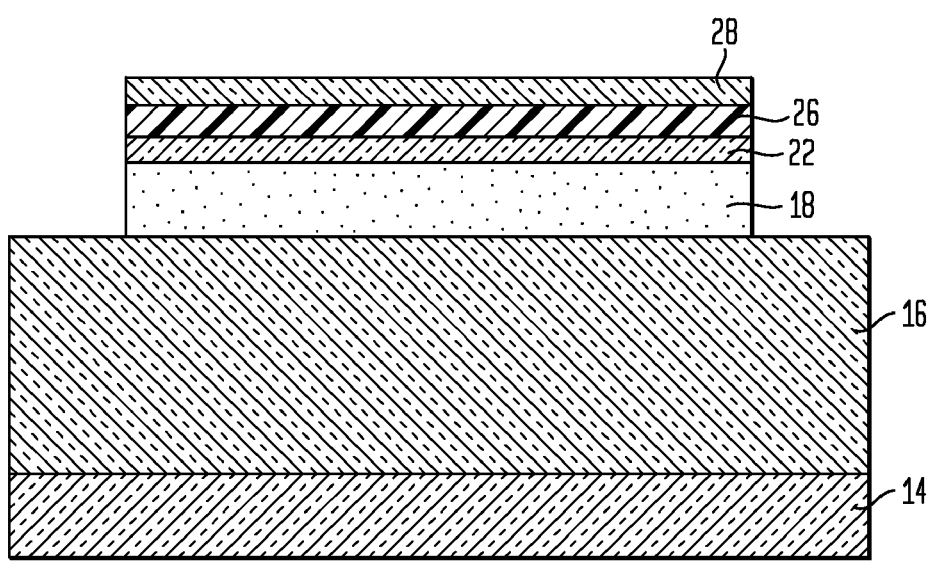
Figure 3A:
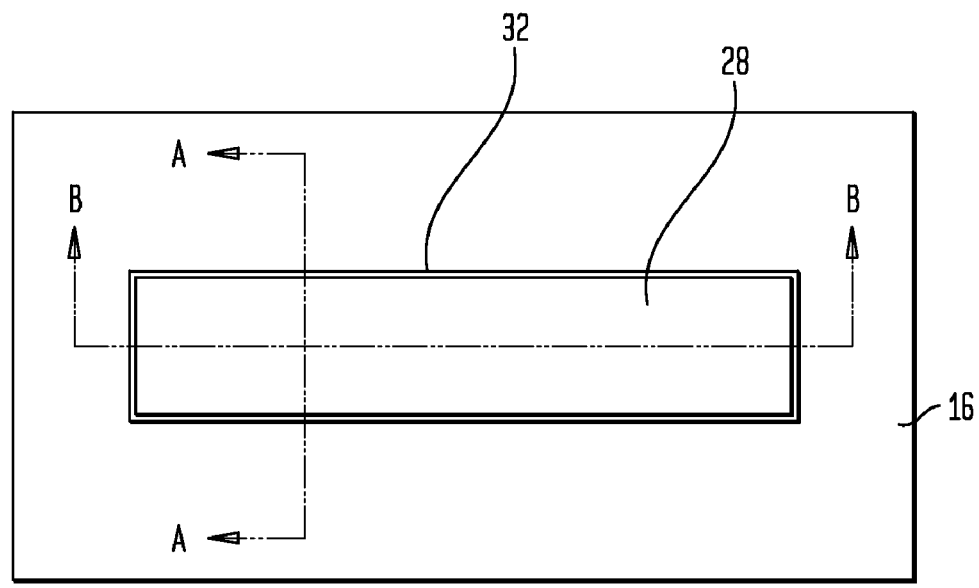
Figure 3B:
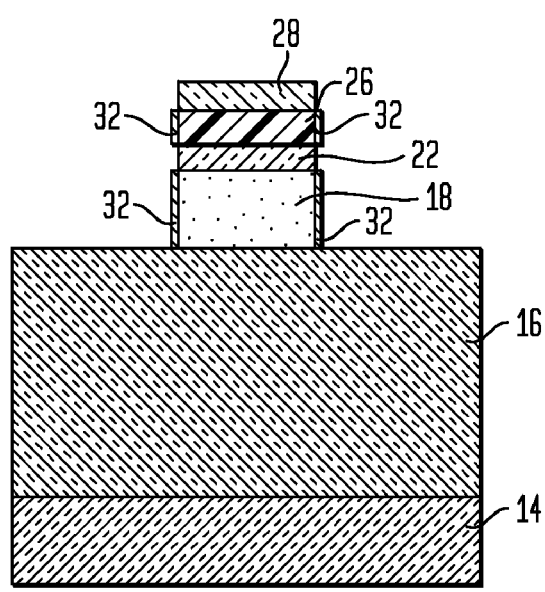
Figure 3C:
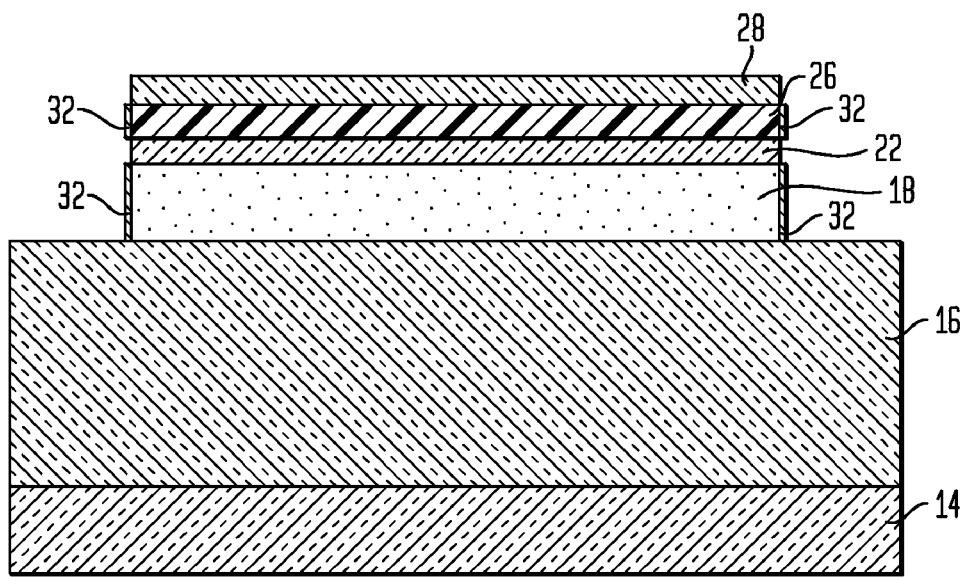

Next, and as shown in FIGS. 2A-2C, exposed portions of the Si-containing layer 18, not protected by the patterned material stack 20, are then etched using the upper patterned nitride layer 28 as an etch mask. This etching step removes all the exposed portions of the Si-containing layer 18, stopping on the upper surface of the buried insulating layer 16. The etching step is performed utilizing an etching process such as anisotropic reactive ion etching that selectively removes the Si-containing layer 18. If the patterned resist 30 was not previously stripped from the structure, it can be removed following this etching process.

Note that in FIGS. 2A-2C the Si-containing layer 18 is patterned such that the sidewalls thereof all substantially aligned with the sidewalls of the patterned material stack 20. Moreover, in FIGS. 2A-2C, portions of the buried insulating layer 16, not directly beneath the patterned material stack 20, are now exposed.

A dielectric 32 is then formed on the exposed sidewalls of the etched Si-containing layer 18 as well as the exposed sidewalls of the polysilicon layer 26. The dielectric 32 serves as the insulator between the sidewall plate (to be subsequently formed) of the body capacitor and the remaining Si-containing layer 18 (which will form the body of a MOSFET). The dielectric 32 may comprise SiO$_2$, silicon oxynitride, or a high k material (k greater than 4.0, preferably greater than 7.0) such as, for example, Al$_2$O$_3$ or Ta$_2$O$_5$.

The dielectric 32, which can be formed by a variety of techniques including deposition (such as, for example, CVD or PECVD) or thermal (such as oxidation or oxynitridation), has a thickness from about 2 to about 20 nm. More typically, the dielectric 32 has a thickness from about 3 to about 6 nm. The structure including the dielectric 32 that is formed on the exposed sidewalls of the remaining Si-containing layer 18 and the polysilicon layer 26 is shown, for example, in FIGS. 3A-3C.

Figure 4A:
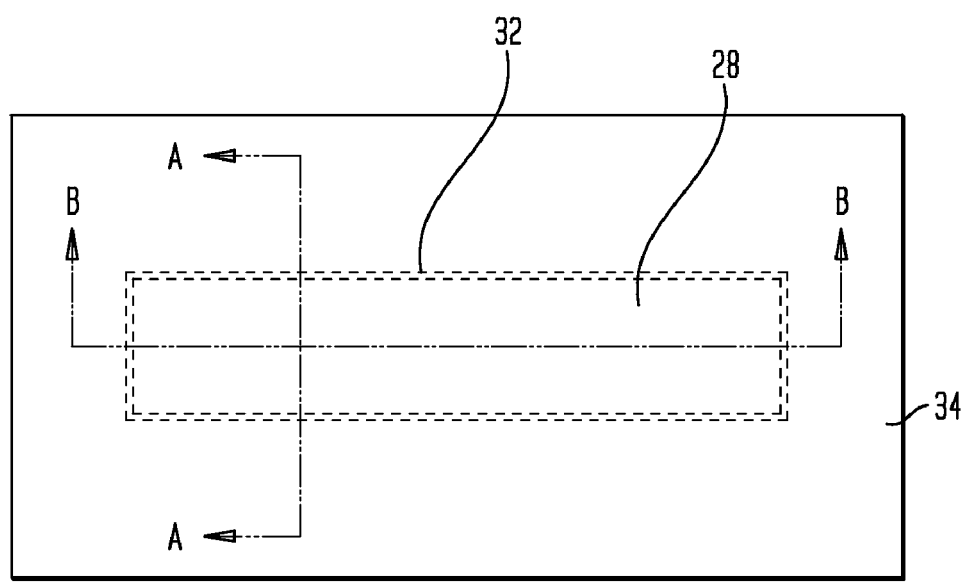
Figure 4B:
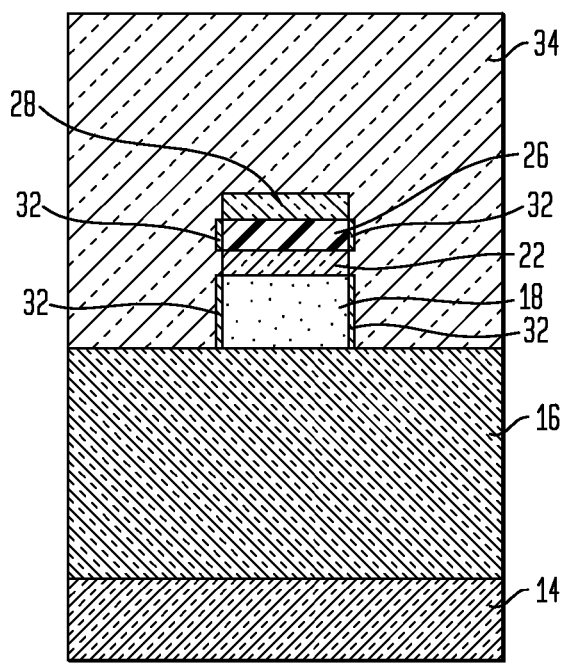
Figure 4C:
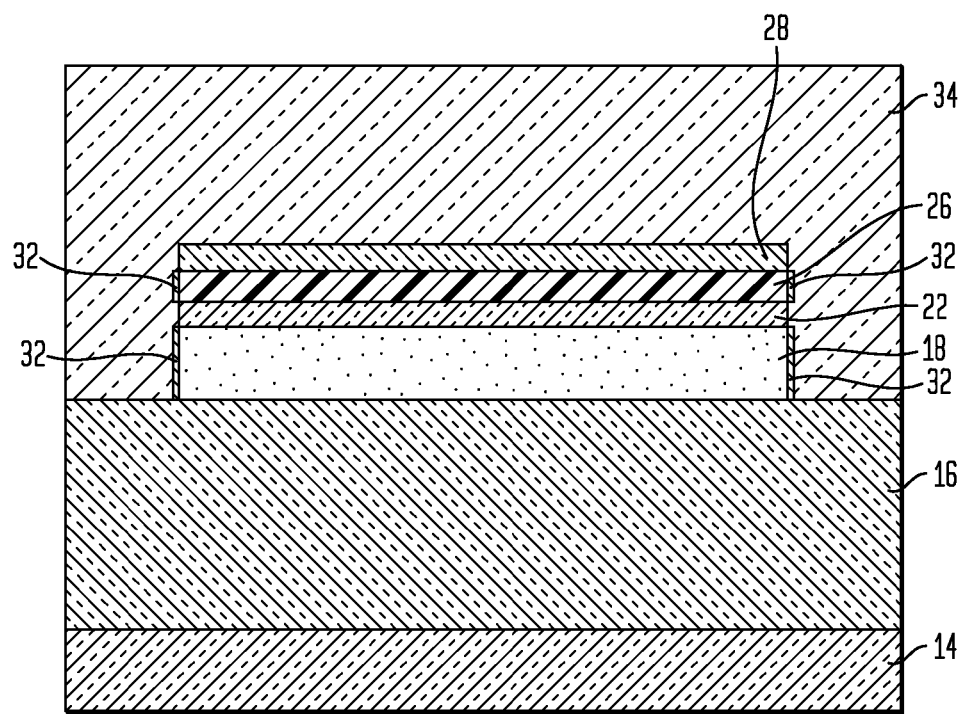

FIGS. 4A-4C show the structure that is formed after an insulating material 34, such as an oxide, is formed over the surface of the exposed buried insulating layer 16 and atop the patterned material stack 20. Any conventional deposition process such as CVD or PECVD can be used to form a layer of the insulating material 34.

Figure 5A:
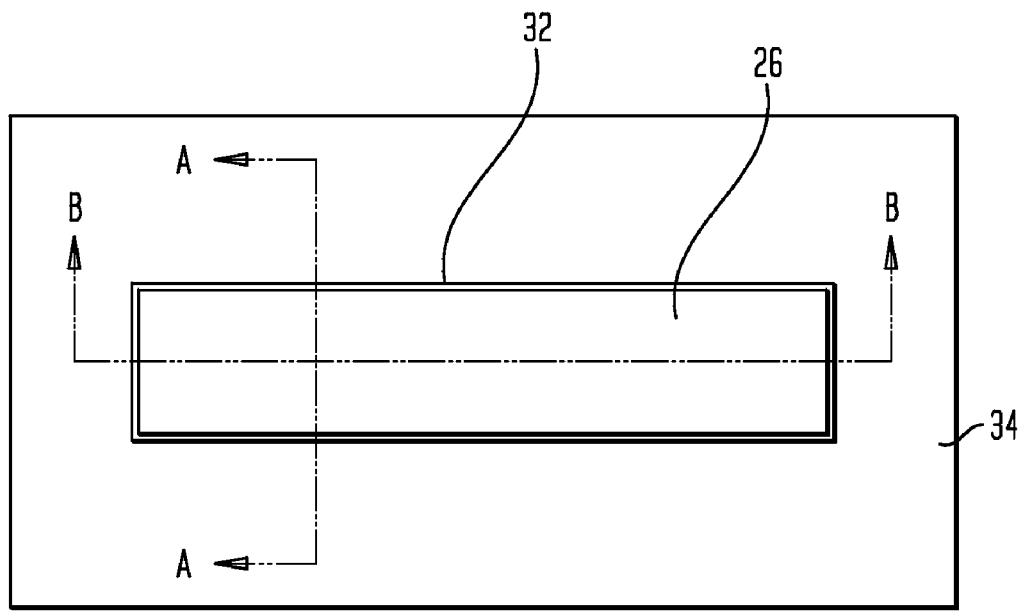
Figure 5B:
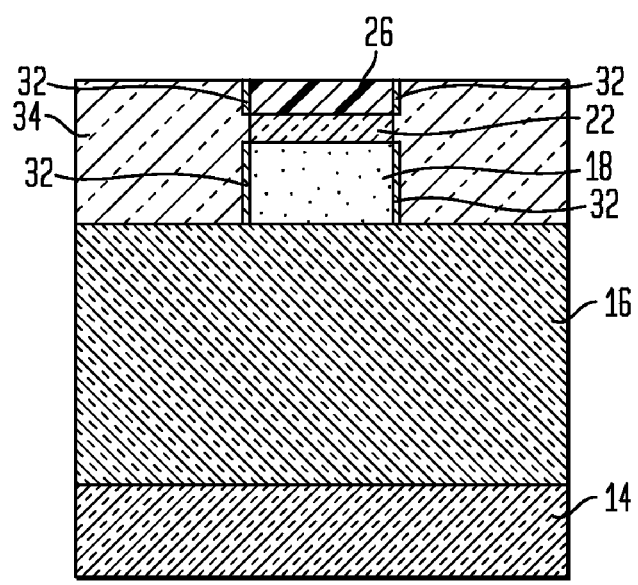
Figure 5C:
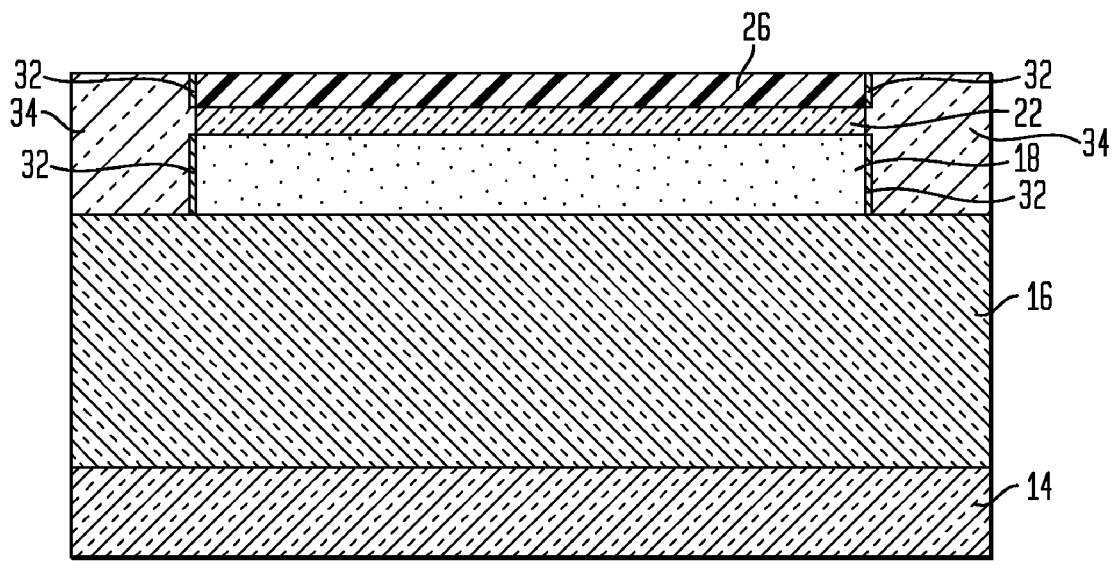

After forming the insulating material 34, the insulating material 34 is planarized so that an upper surface of the insulating material 34 is coplanar with the upper surface of the polysilicon layer 26 of the patterned material stack 20. That is, a planarization process such as chemical mechanical polishing (CMO) and/or grinding is used to provide a structure as shown in FIGS. 5A-5C in which the upper surface of the insulating material 34 is substantially planar to the upper surface of the polysilicon layer 26. It is noted that the planarization process used in this step of the present invention removes the upper nitride layer 28 of the patterned material stack 20. As shown in FIGS. 5A-5C, isolation regions 34 are formed adjacent to the remaining portions of layers 26, optionally 24, 22 and layer 18.

Figure 6A:
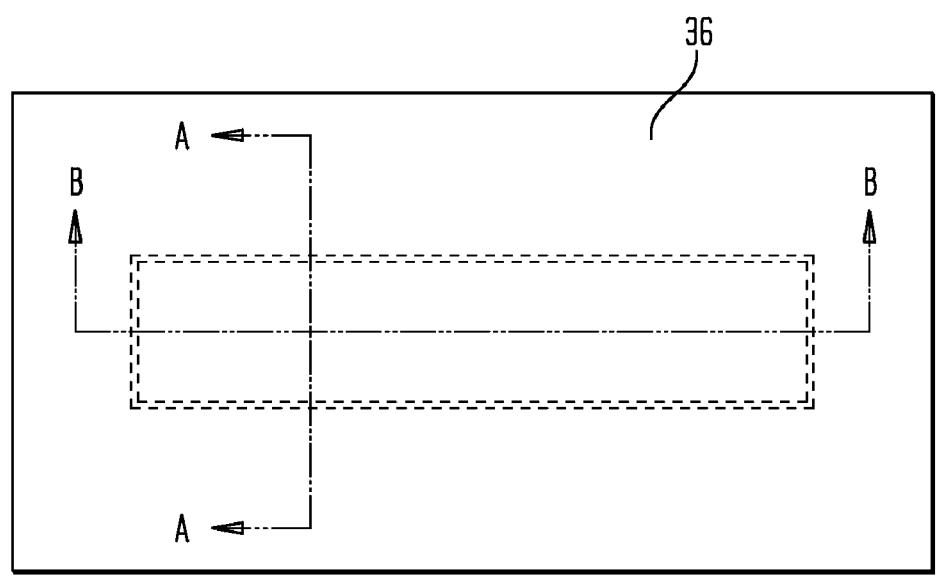
Figure 6B:
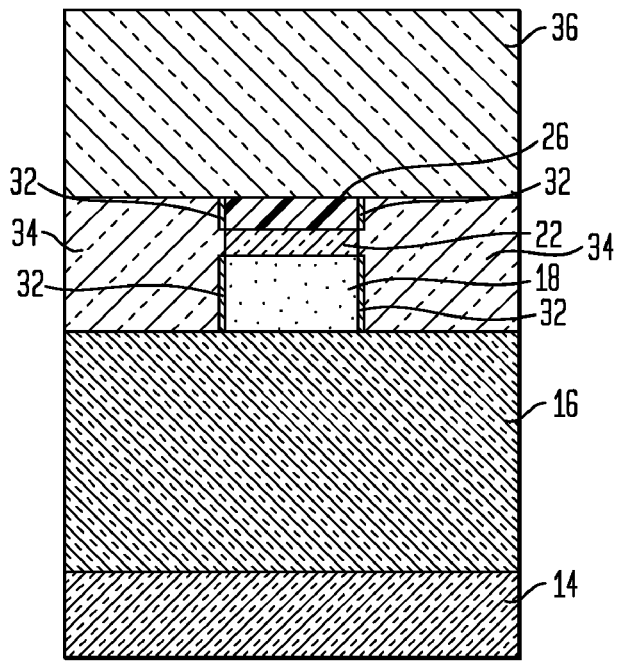
Figure 6C:
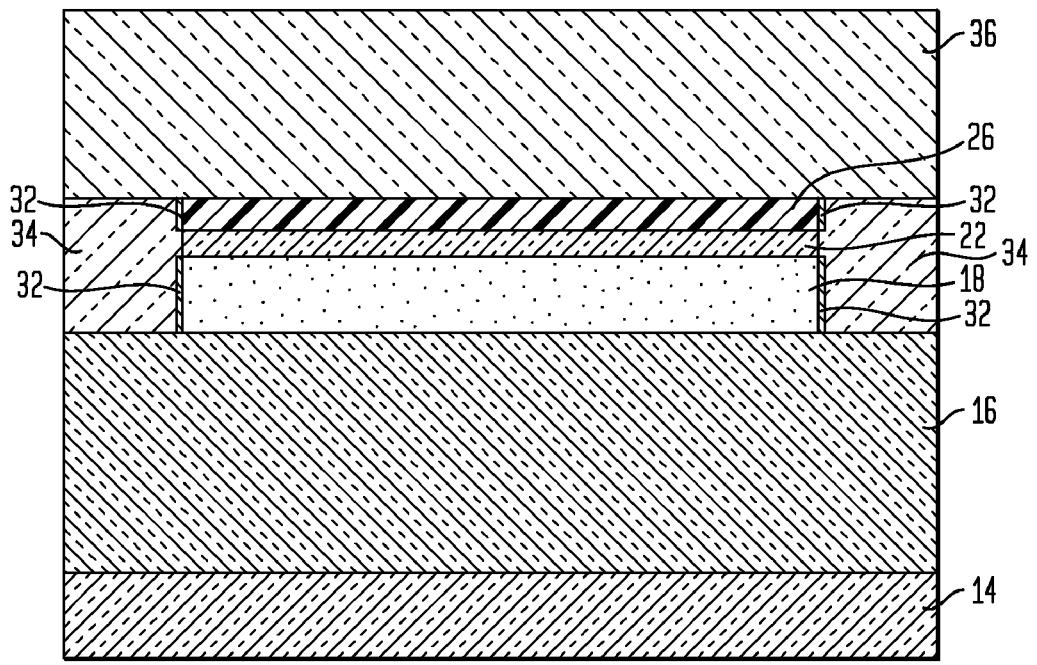

A pad nitride layer 36 is then deposited by conventional techniques over the planarized structure shown in FIGS. 5A-5C providing the structure shown, for example, in FIGS. 6A-6C. The pad nitride layer 36 is a relatively thick layer since it determines the height of the wordline wiring to be subsequently formed. Typically, the pad nitride layer 36 has a thickness from about 30 to about 150 nm.

Figure 7A:
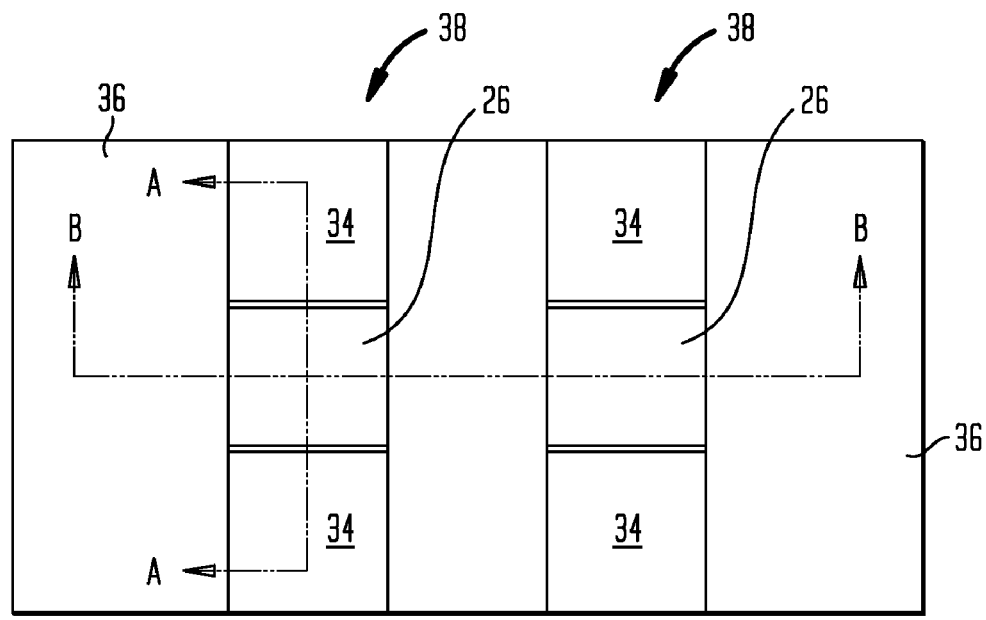
Figure 7B:
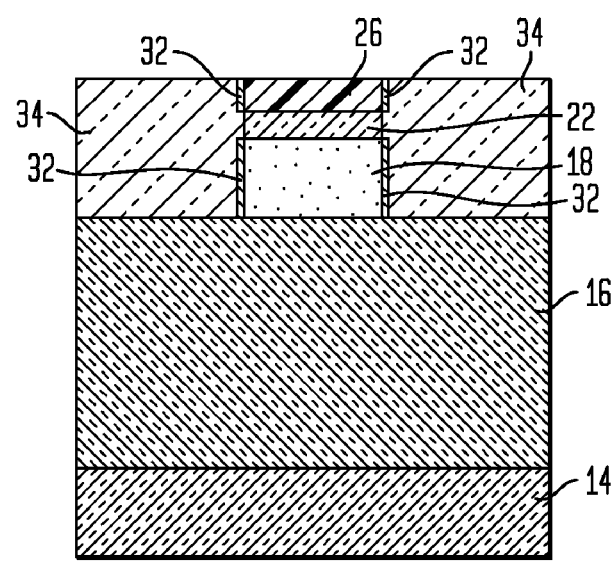
Figure 7C:
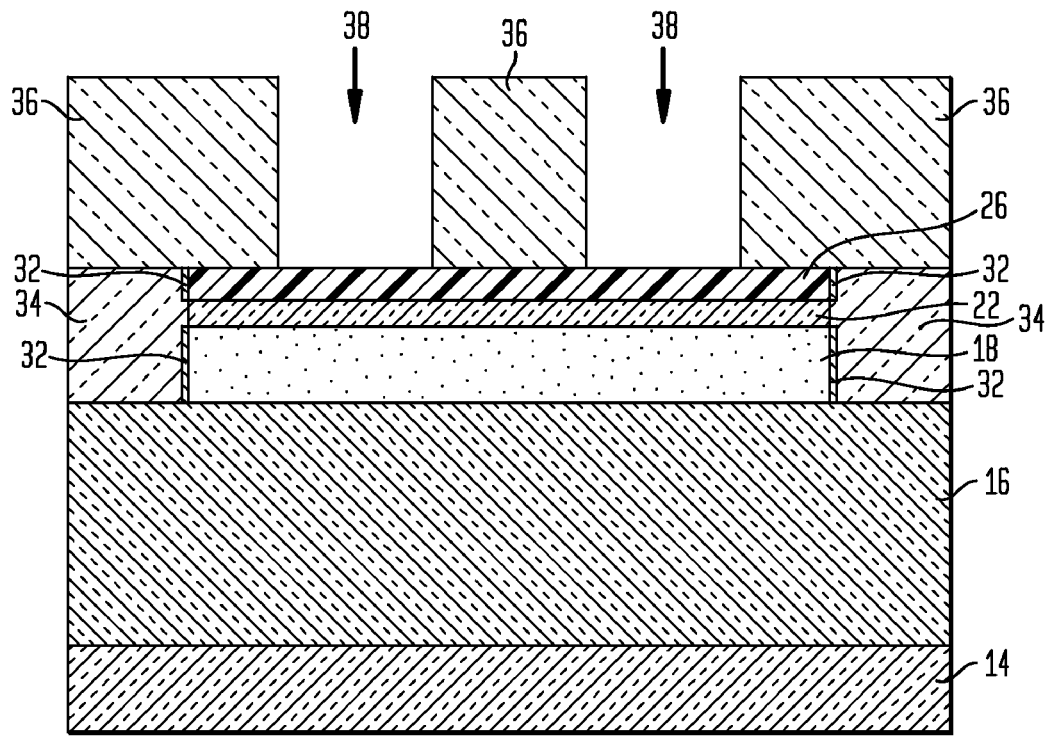

Stripes (i.e., openings or troughs) 38 are then formed through the pad nitride layer 36 stopping on the upper surface of the polysilicon layer 26 in the active region (see FIG. 7C) and on the surface of insulating material 34 in the region that lies to the periphery of the active region (see FIG. 7B). The stripes 38 are formed by lithography and etching. The etching step is performed by utilizing an anisotropic reactive ion etch for silicon nitride that is selective to silicon and silicon oxide. The stripes 38 define the location of the sidewall capacitor plates, which will be self-aligned to the body (i.e., the remaining Si-containing layer 18), and the location of the wordline gate conductors. Both the sidewall capacitor plates and the wordlines are self-aligned to each other since they will be defined by and registered to the same structural features (i.e., through the opening in the pad nitride layer 36). The structure including the stripes 38 is shown, for example, in FIGS. 7A-7C.

Figure 8A:
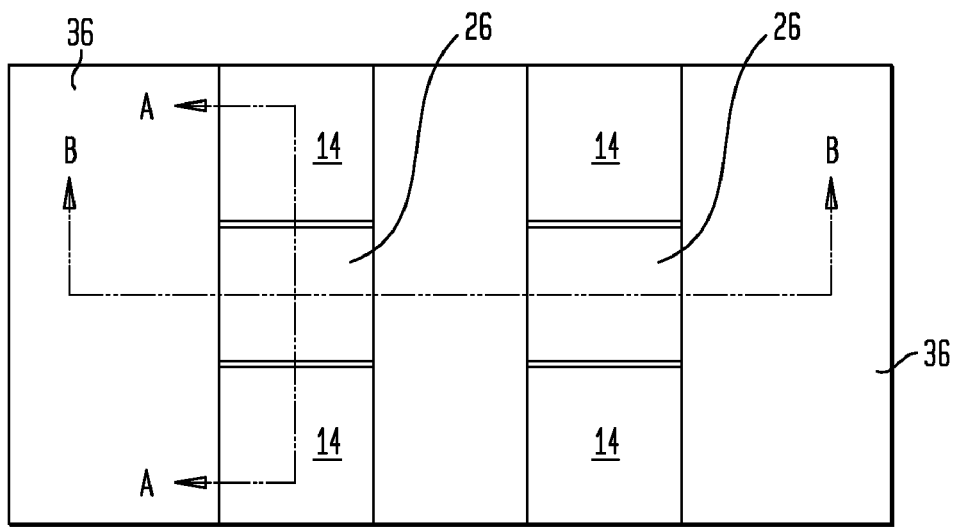
Figure 8B:
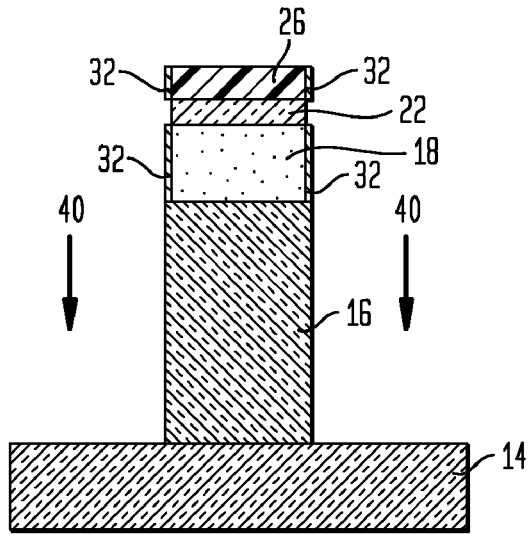
Figure 8C:
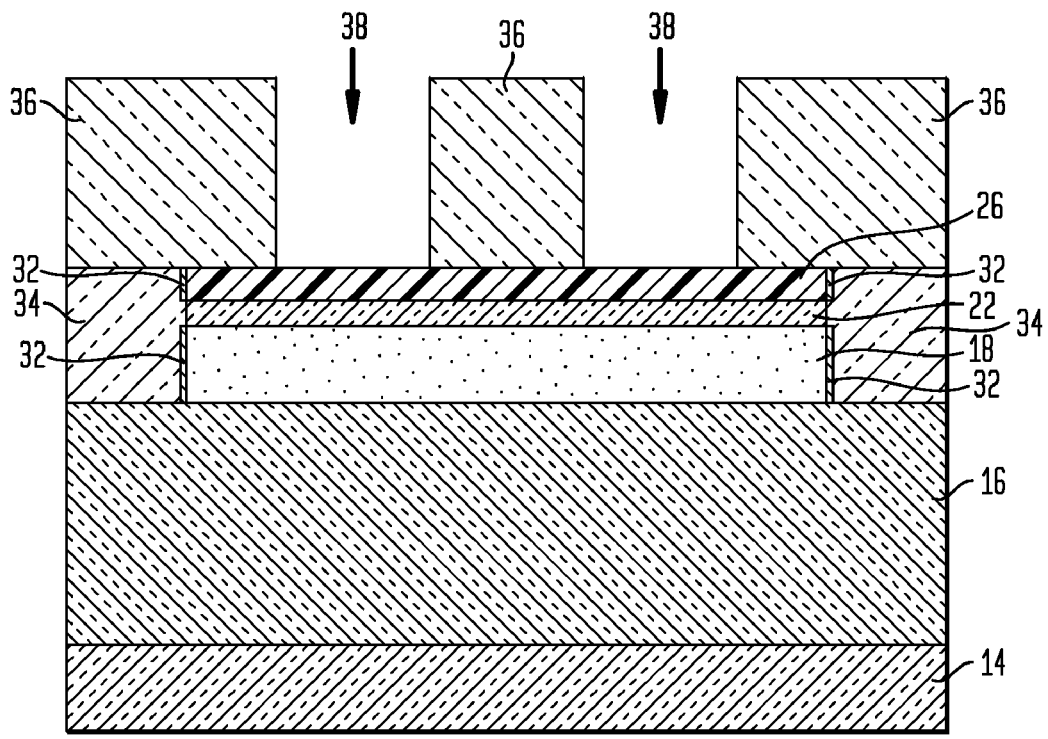

The exposed surfaces of the insulating material 34 outside of the active region shown along line A-A are then etched by a dry etching process such as anisotropic reactive ion etching through layer 34 and the underlying buried insulating layer 16 stopping on the upper surface of semiconductor layer 14. The etching process used in this step of the present invention, which provides the structure shown in FIG. 8A-8C, is selective to silicon and silicon nitride. In FIG. 8B, reference numeral 40 is used to define the recessed region formed by this step of the present invention; note that no etching occurs in the active area during this step of the present invention, since it is protected by either polysilicon layer 26 or pad nitride 36.

Figure 9A:
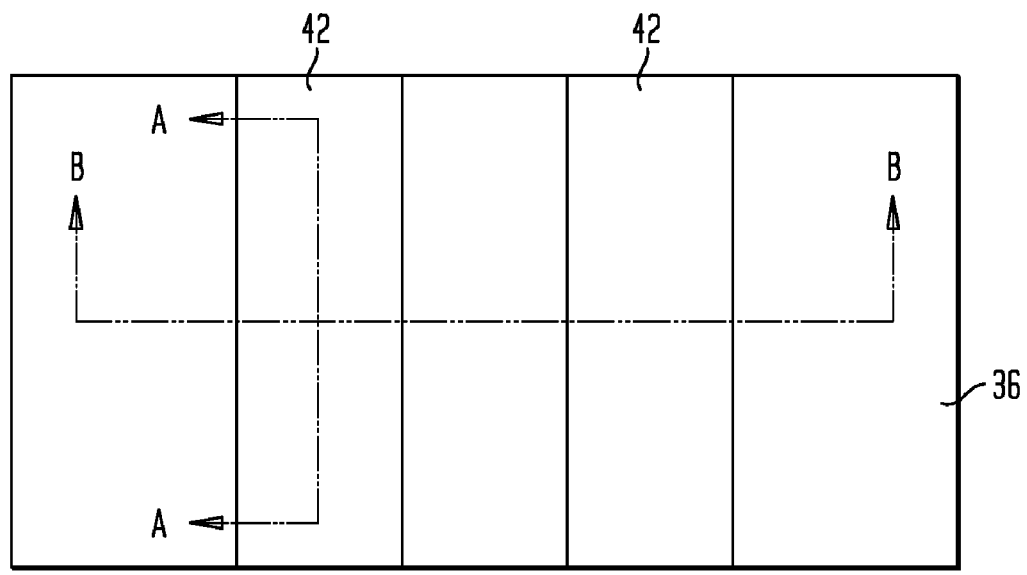
Figure 9B:
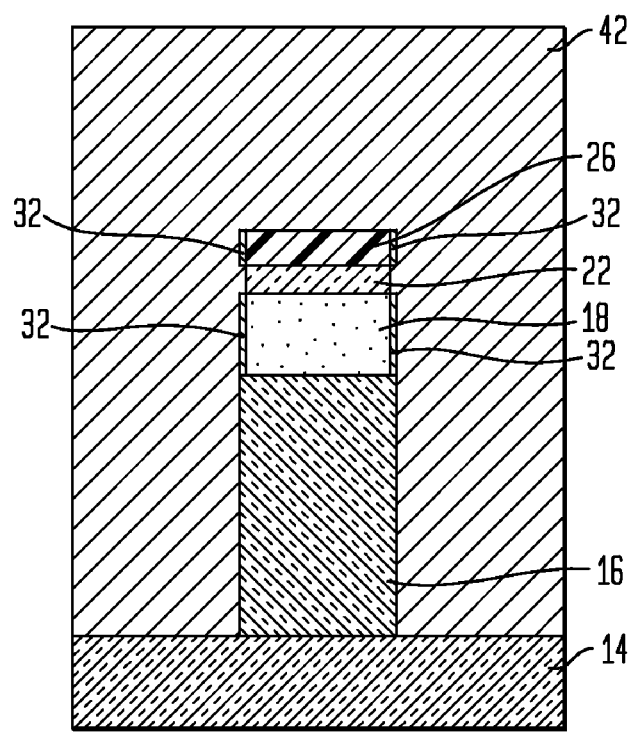
Figure 9C:
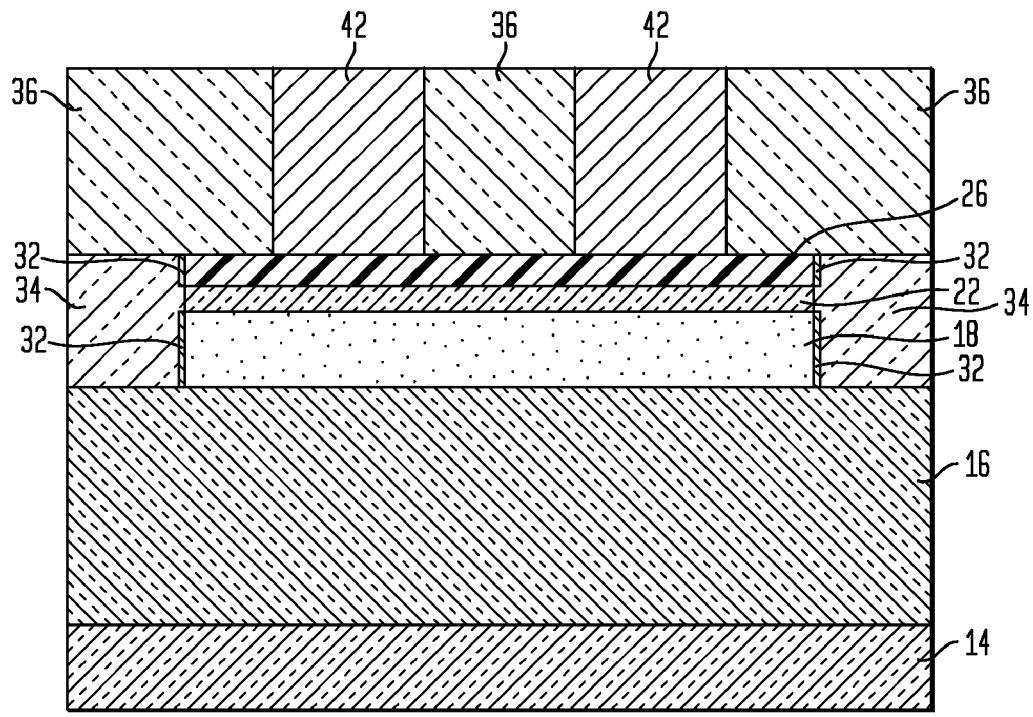
Figure 10A:
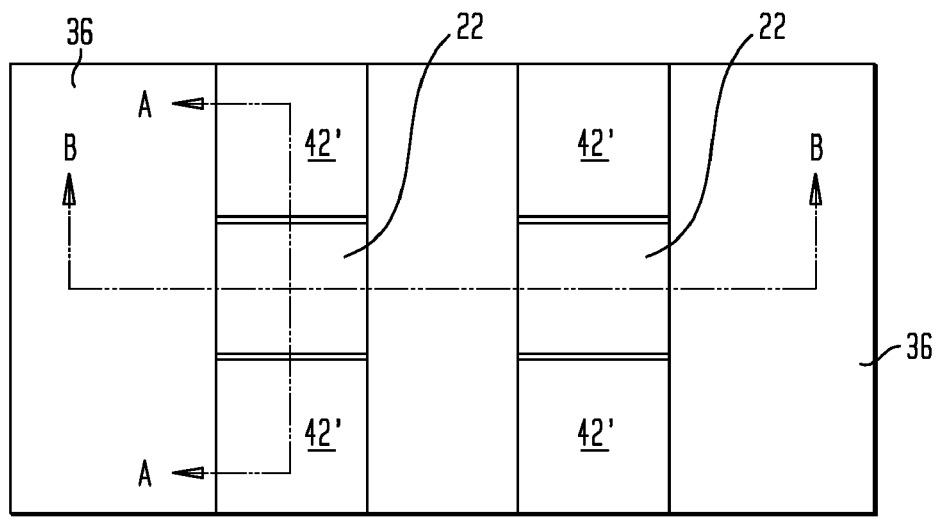
Figure 10B:
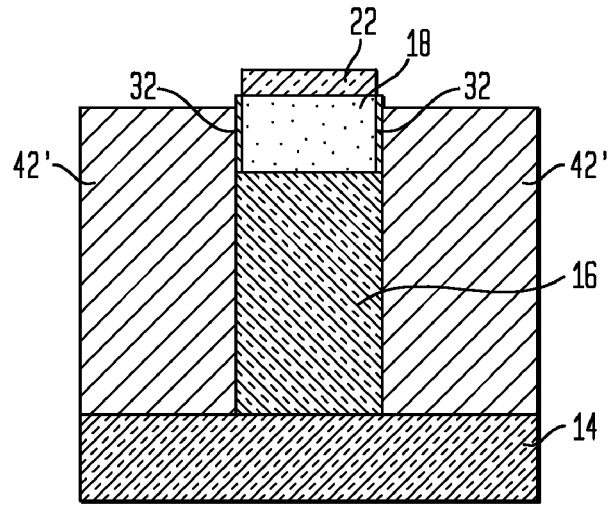
Figure 10C:
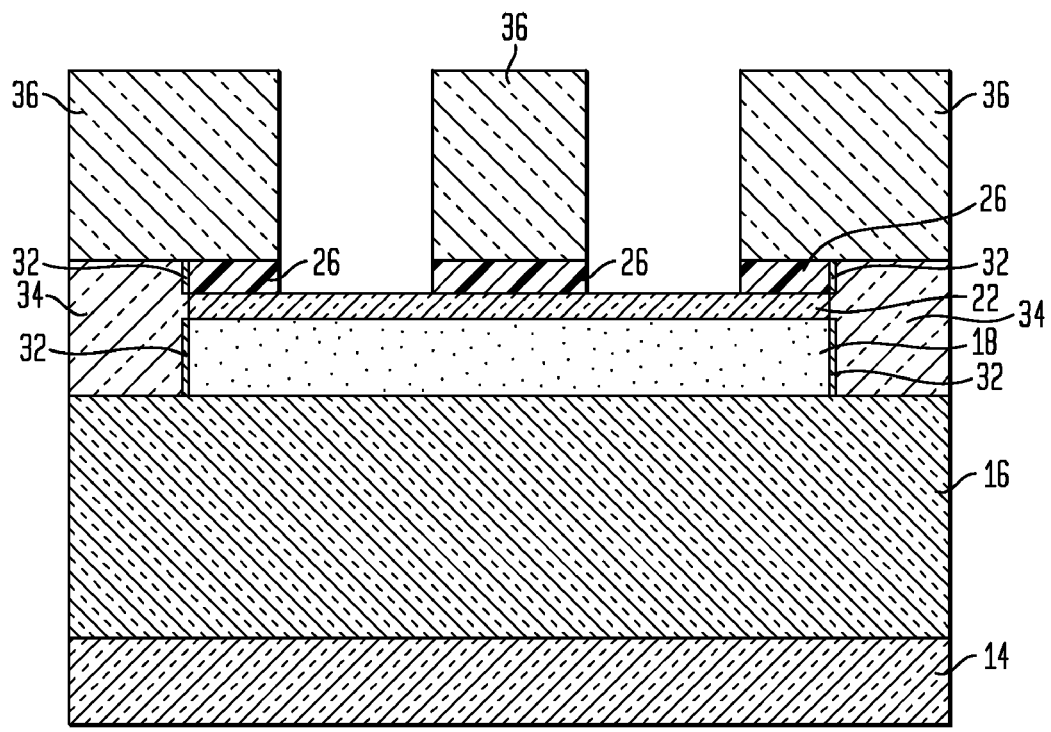

The recessed region 40 and the stripes 38 are then filled with a conductor 42 and then the conductor 42 is planarized to the upper surface of pad nitride 36 providing the structure shown in FIGS. 9A-9C. The filling process includes any conventional deposition process, while planarization is performed utilizing CMP and/or grinding. The conductor 42 comprises a metal, a metal alloy, a metal silicide, polysilicon or a combination thereof, Preferably, polysilicon is used as the conductor 42. When polysilicon is used as the conductor 42, it is typically formed using an in-situ doping deposition process. The polysilicon is doped with the same dopant polarity as the buried layer that was previously formed into the semiconductor layer 14 as described in connection with the structure shown in FIGS. 1A-1C. Preferably, the dopant polarity of the polysilicon conductor 42 and of the deep implant region described above in FIGS. 1A-1C are P-type since a P-type workfunction for the capacitor plate will result in maximum body hole concentration, for the nMOSFETs in this exemplary embodiment.

The exposed conductor 42 is then etched selective to nitride and oxide, recessing the top surface of the conductor 42 slightly below the top surface of the Si-containing layer 18. See, for example, the structure shown in FIG. 10B. In this step, all the exposed conductor 42 over the active region as well as portions of the polysilicon layer 28 are removed which exposes a top surface of nitride layer 22. See, for example, the structure shown in FIG. 10C. In embodiments in which the optional oxide marker 24 is present in the structure, and when that layer is reached during the course of etching the conductor 42 in the active region, the oxide signature is detected to indicate that the remaining amount of conductor 42 to be etched is slightly thicker than the lower nitride layer 22. The use of the optional oxide marker layer 24 results in excellent control of the depth of the conductor recess below the top surface of the Si-containing layer 18. The recessed conductor forms the sidewall plate conductors 42'.

Figure 11A:
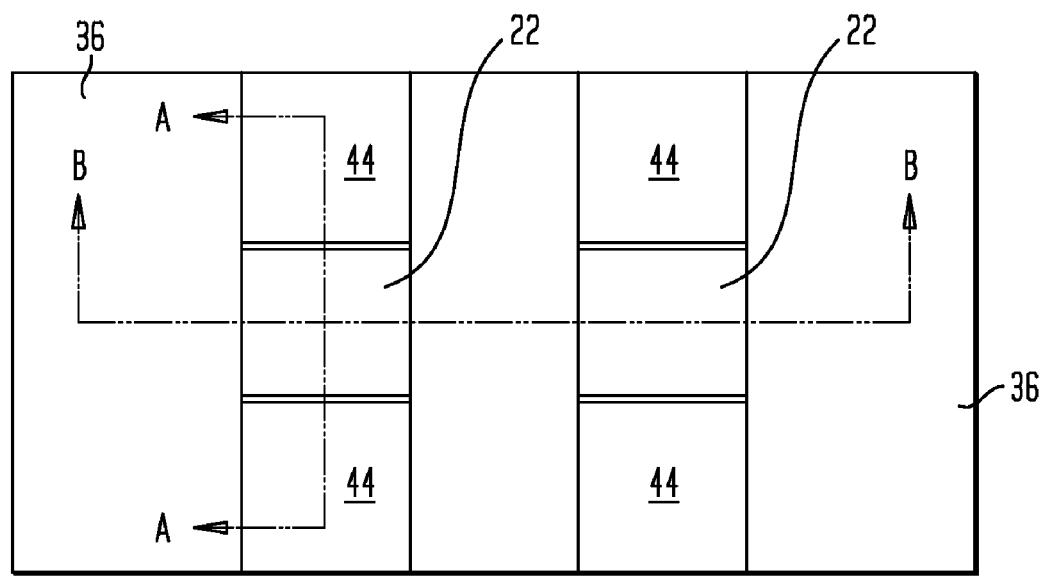
Figure 11B:
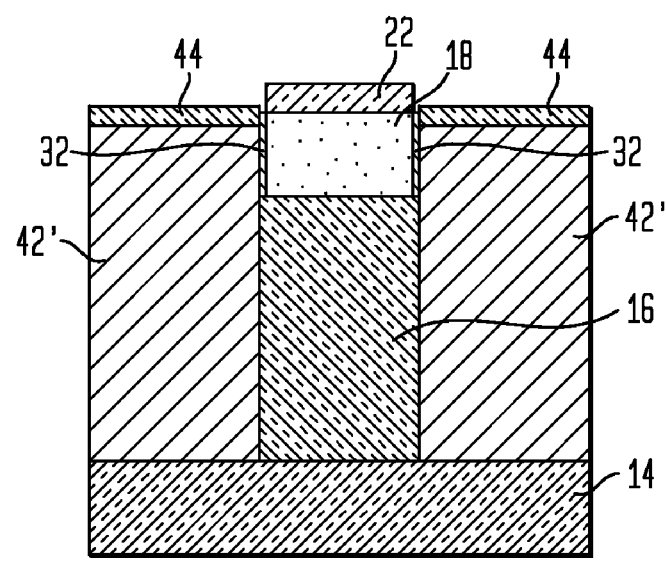
Figure 11C:
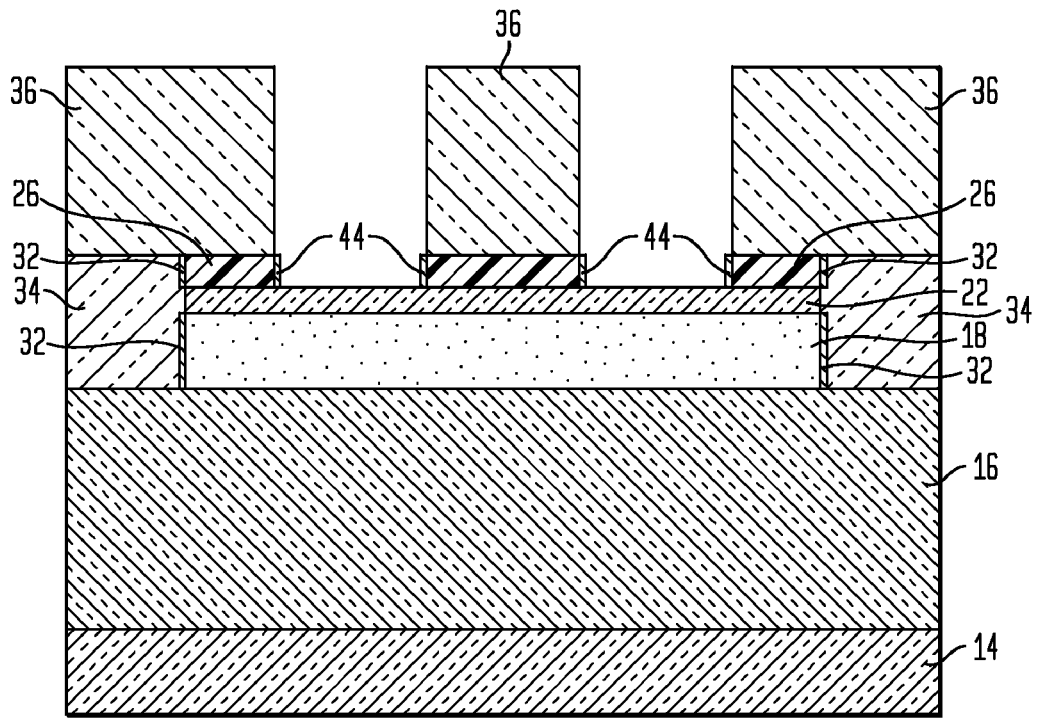

Next, and as shown in FIGS. 11A-11B, an oxide layer 44 having a precisely controlled thickness is formed over the top surface of the recessed conductor 42'. This oxide layer serves as an insulating layer between the body capacitor plate and the subsequently formed overlying wordline conductor. The oxide layer 44 is formed utilizing an oxidation process to a thickness from about 5 to about 20 nm. The surface of the Si-containing layer 18 in the active region (See, FIG. 11C) is protected during this thermal oxidation step by the nitride layer 22. Oxide layer 44 is however formed on the exposed sidewalls of polysilicon layer 26 in the active region.

Figure 12A:
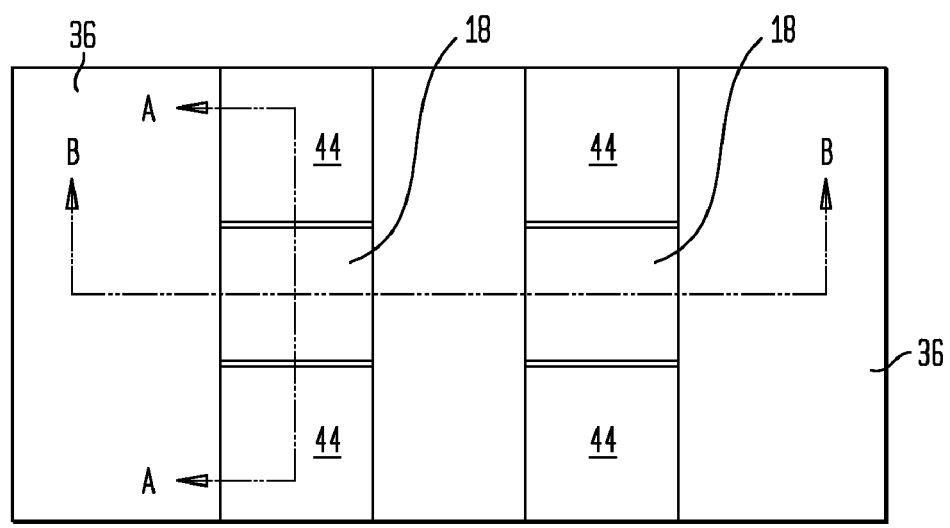
Figure 12B:
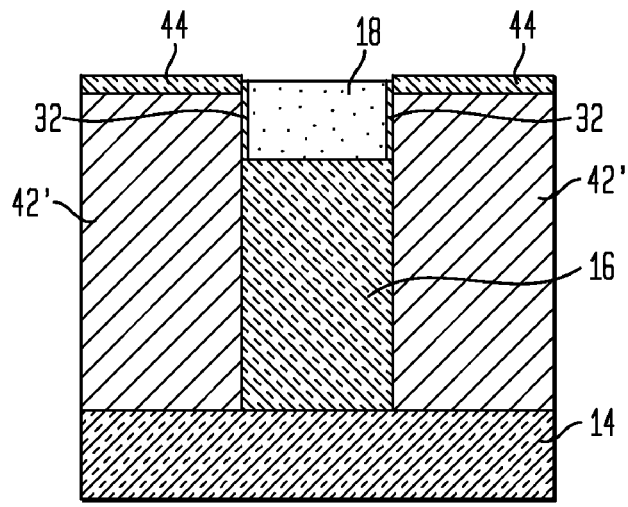
Figure 12C:
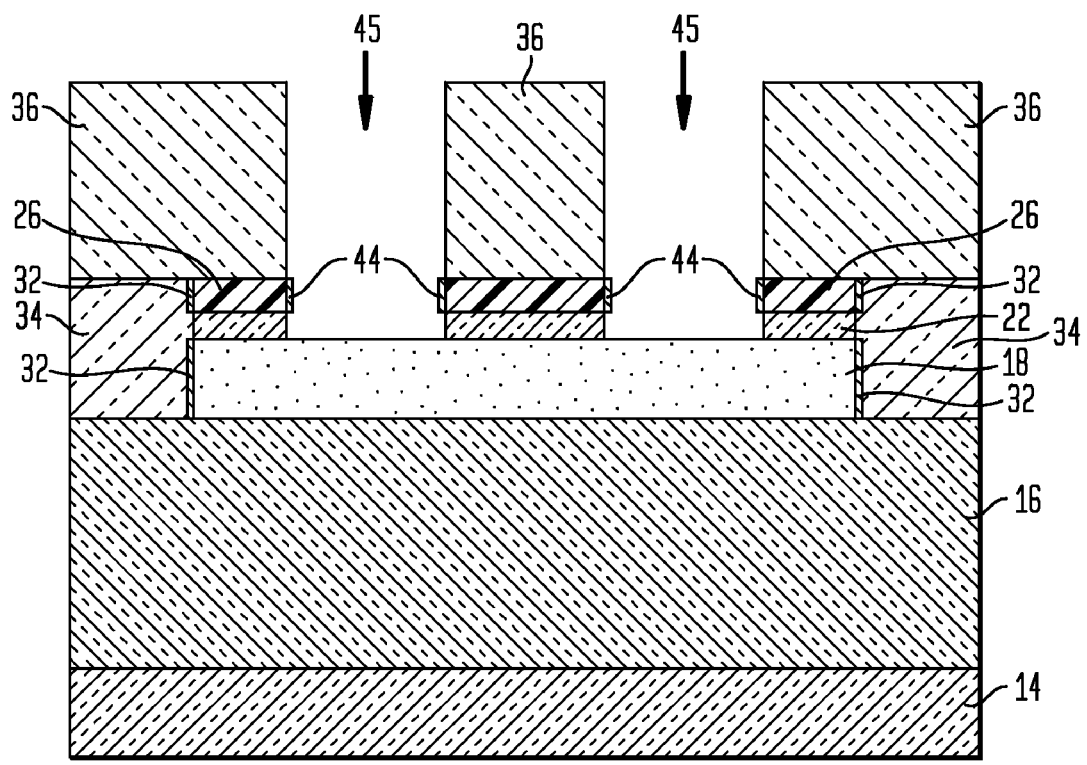

The exposed nitride layer 22 in the active region that overlays the Si-containing layer 18 is then removed, preferably with an anisotropic etch to minimize undercutting of the nitride layer 22 elsewhere on the Si-containing layer 18. At this point in the process, channel doping (not shown) may be introduced into the exposed portions of the Si-Containing layer 18 using conventional ion implantation techniques. A screen oxide (also not shown) may optionally be formed prior to the implantation process and thereafter removed. The resultant structure that is formed after the foregoing step of removing the exposed nitride layer 22 overlaying the Si-containing layer 18 is shown in FIGS. 12A-12C, for example. Reference numeral 45 is used to denote the openings formed during this step of the present invention.

Figure 13A:
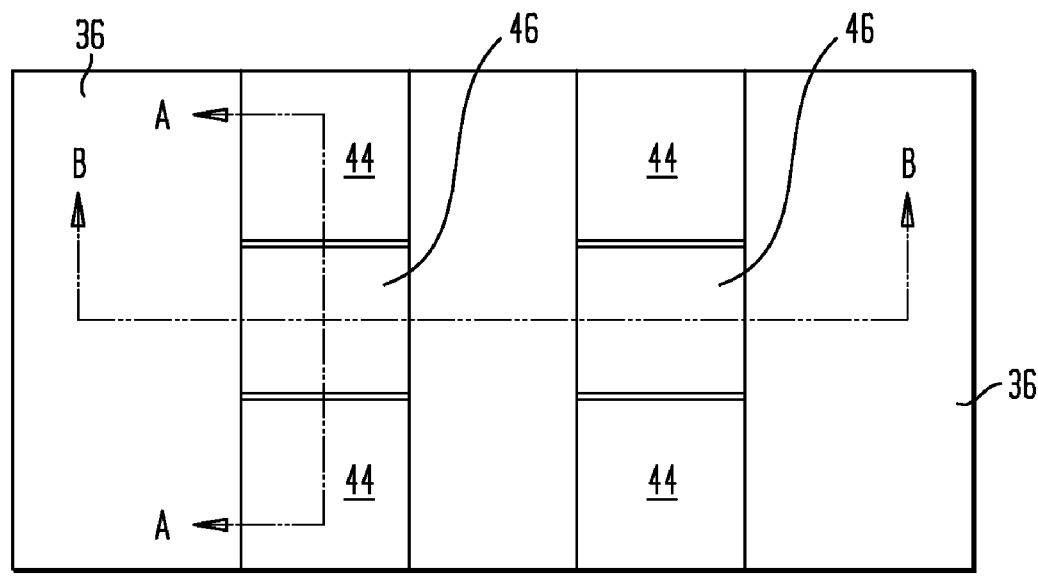
Figure 13B:
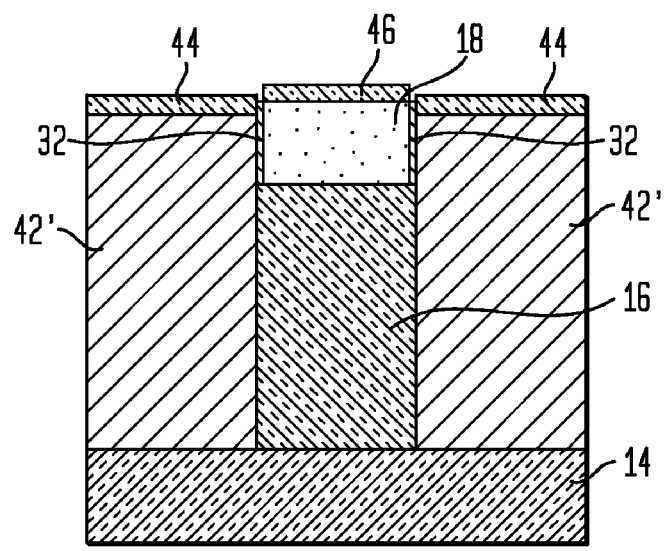
Figure 13C:
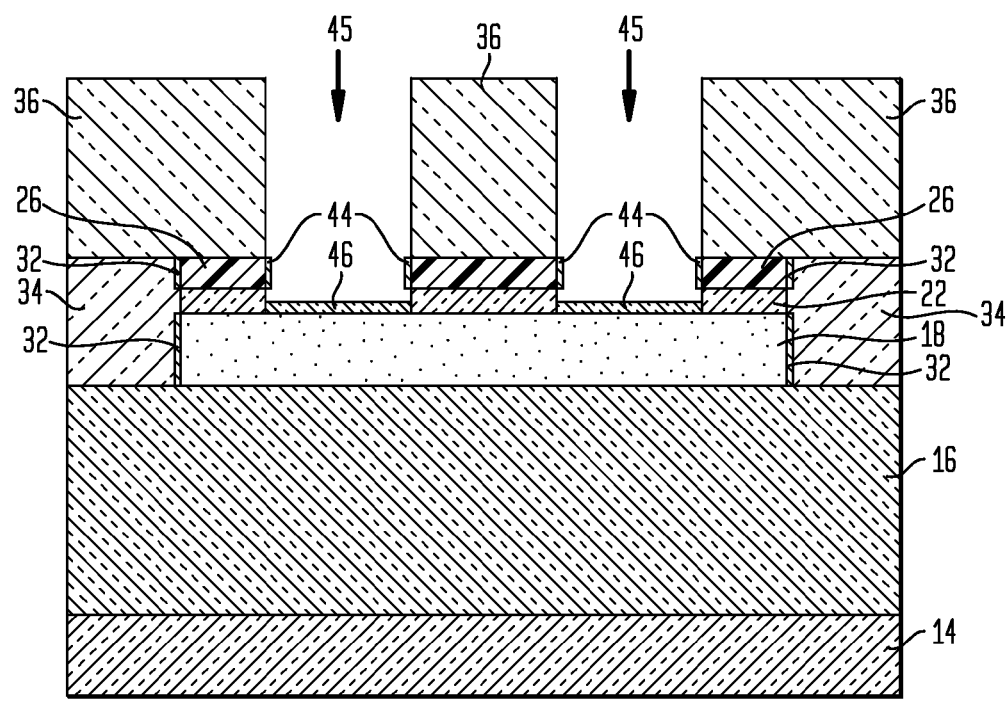

A transfer gate dielectric 46 is then formed on the exposed surface of Si-containing layer 18 through opening 45. The transfer gate dielectric 46 comprises an oxide, oxynitride or a high k (k greater than 4.0, preferably greater than 7.0) dielectric. The thickness of the transfer gate dielectric 46 is typically from about 1 to about 10 nm. Any conventional deposition process or thermal process can be used to form the transfer gate dielectric 46. FIGS. 13A-13C show the structure after the transfer gate dielectric 46 has been formed.

Figure 14A:
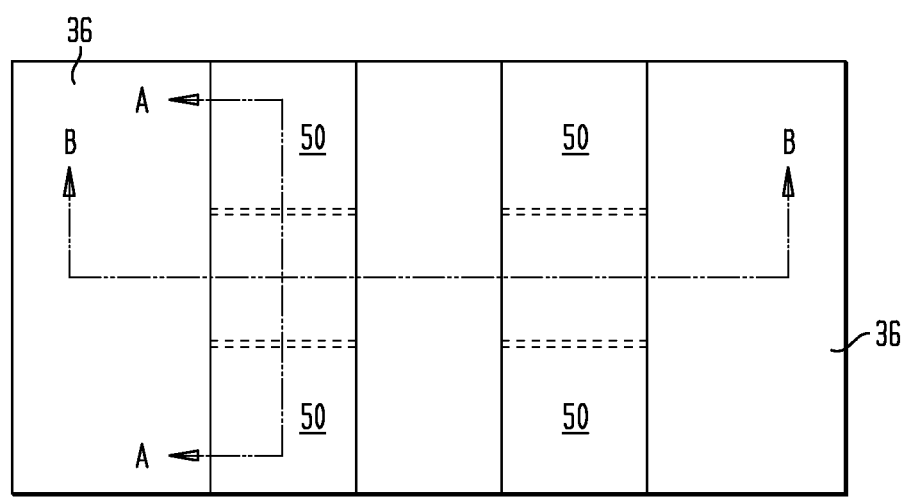
Figure 14B:
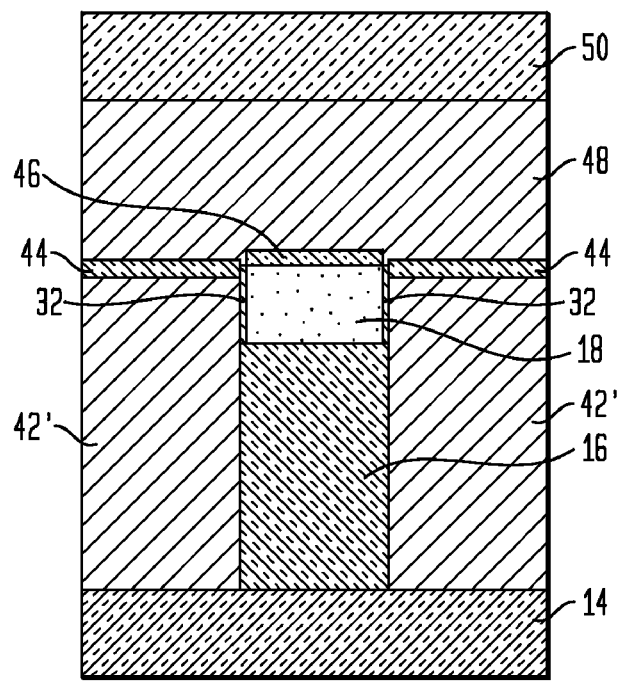
Figure 14C:
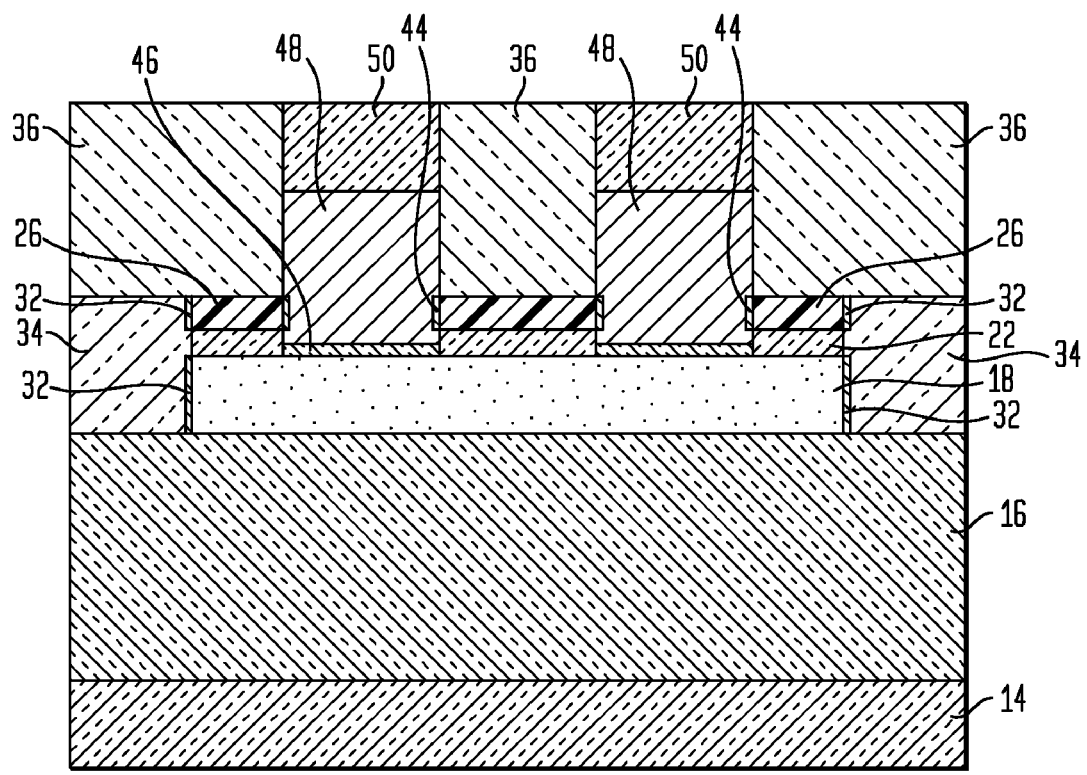

FIGS. 14A-14C shows the structure after wordline gate conductor 48 and an insulating cap 50 are formed. Specifically, the wordline gate conductor 48 is formed through the opening 45 atop the transfer gate dielectric 46 by deposition. Following the deposition process, the wordline gate conductor 48 is planarized to the upper surface of the pad nitride layer 36. The planarized wordline gate conductor 48 is then recessed utilizing a timed etching process such as reactive ion etching. The wordline gate conductor 48 is comprised of a conductive material including, for example, a metal, metal alloy, metal silicide, polysilicon or any combination thereof. The insulating cap 50, typically an oxide, is then deposited and planarized utilizing conventional processes well known in the art.

Figure 15A:
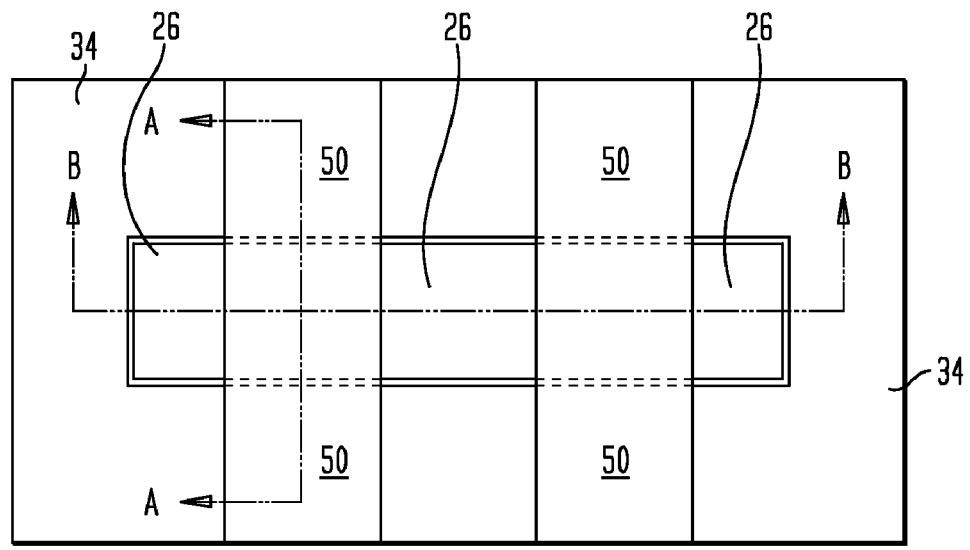
Figure 15B:
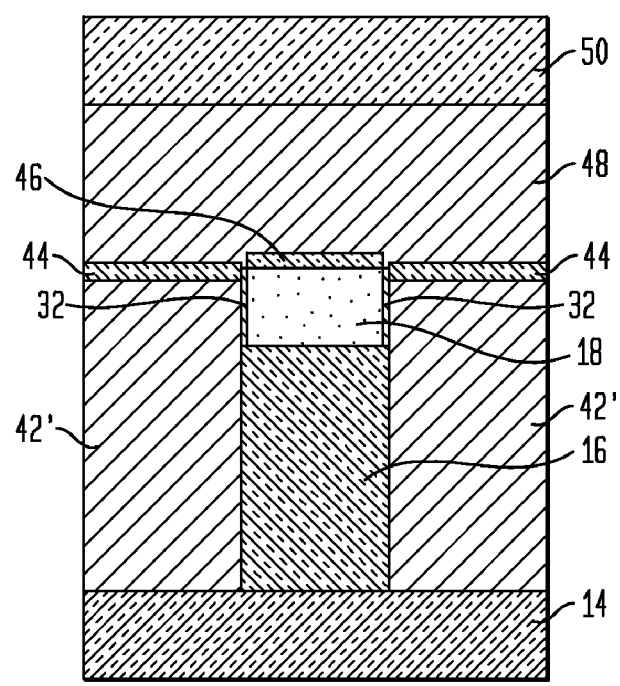
Figure 15C:
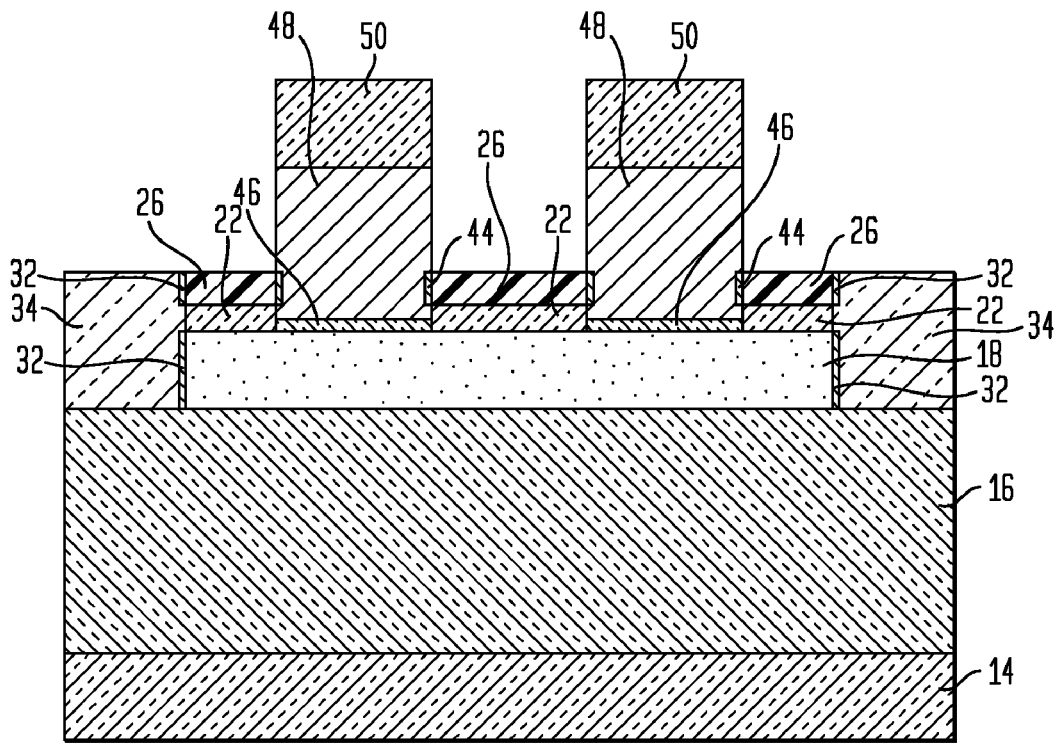
Figure 16A:
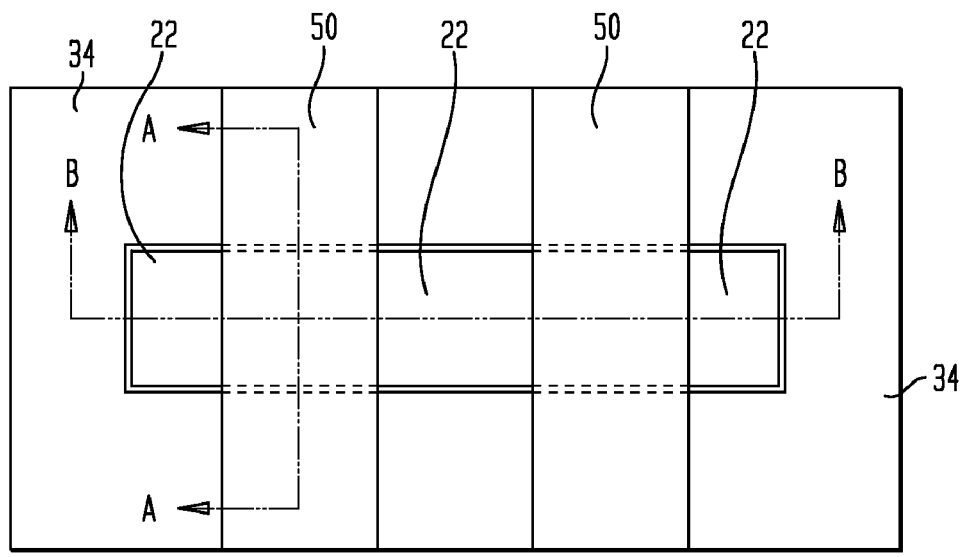
Figure 16B:
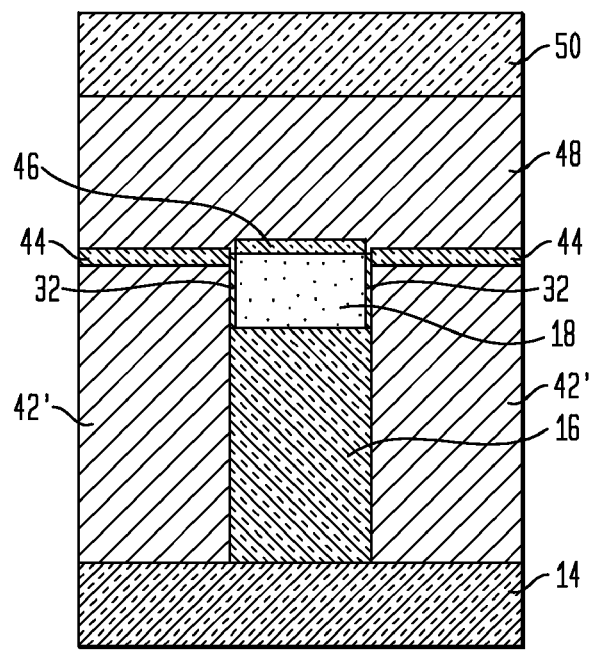
Figure 16C:
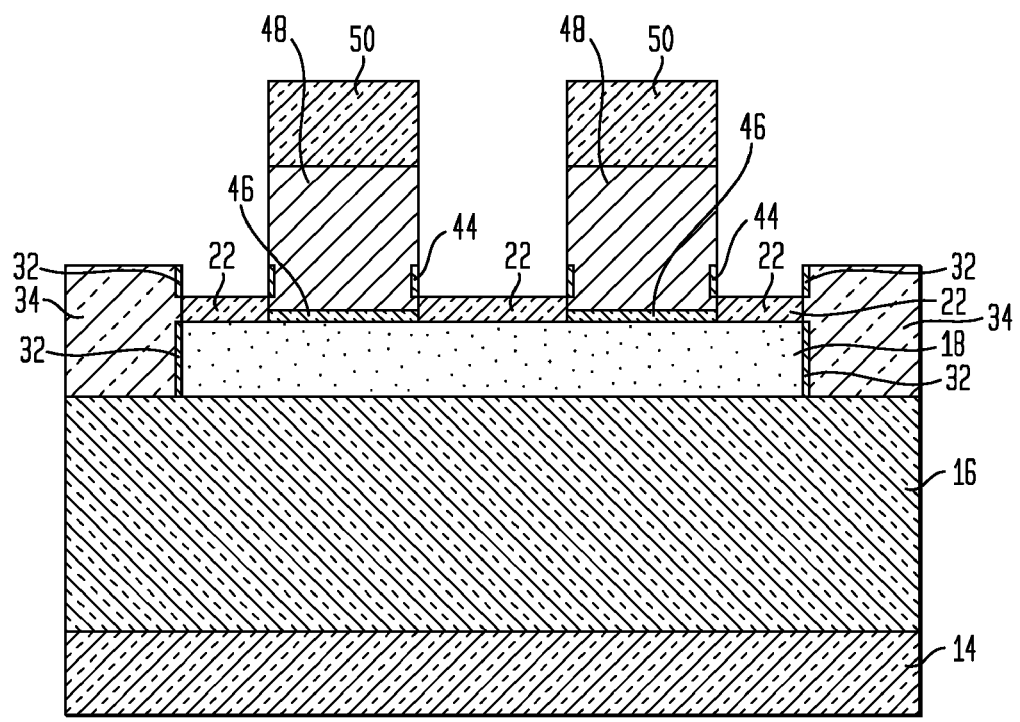

The exposed pad nitride layer 36 is then removed utilizing a well known etching method such as, for example, hot phosphoric acid or reactive ion etching, exposing the polysilicon layer 26 and insulating material 34. The resultant structure is shown in FIGS. 15A-15C.

The exposed polysilicon layer 26 over the active region is then removed by etching, e.g., reactive ion etching, thus exposing the nitride layer 22 over the active region. The structure formed after this step of the present invention has been performed is shown, for example, in FIGS. 16A-16C.

Figure 17A:
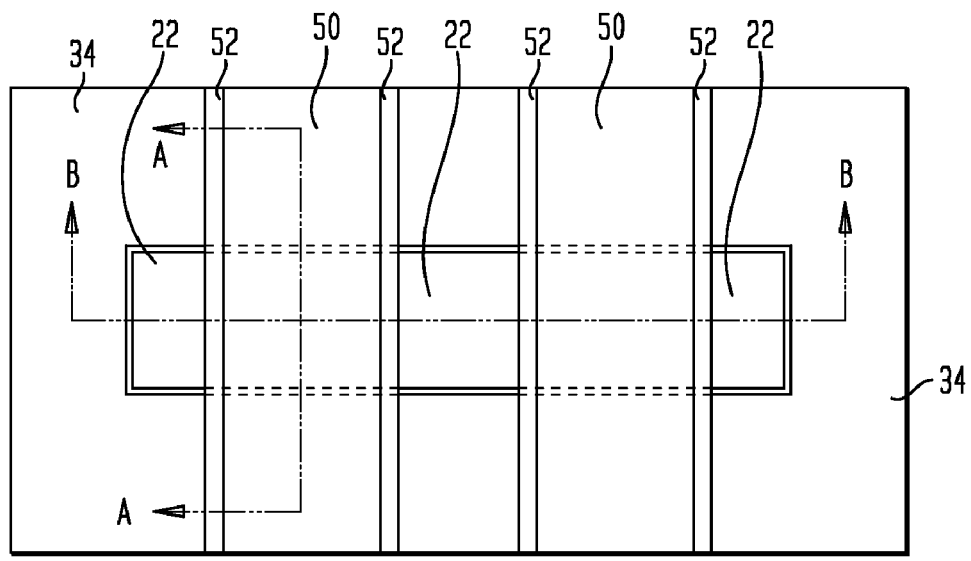
Figure 17B:
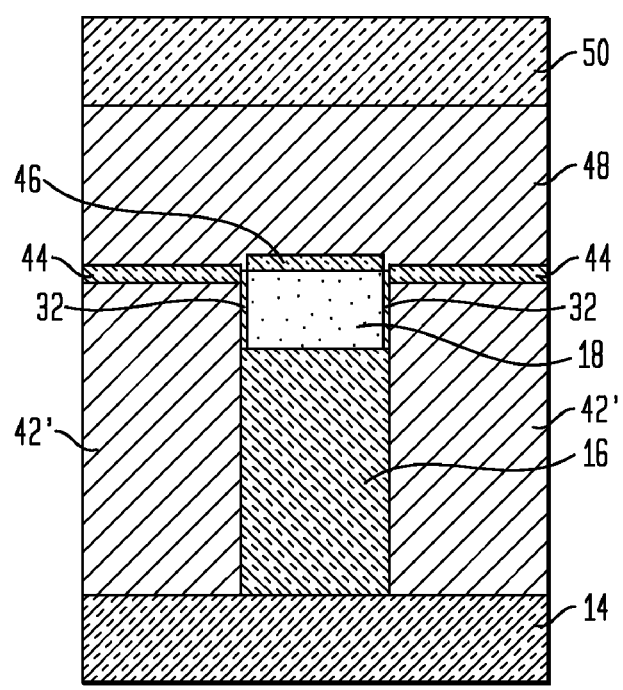
Figure 17C:
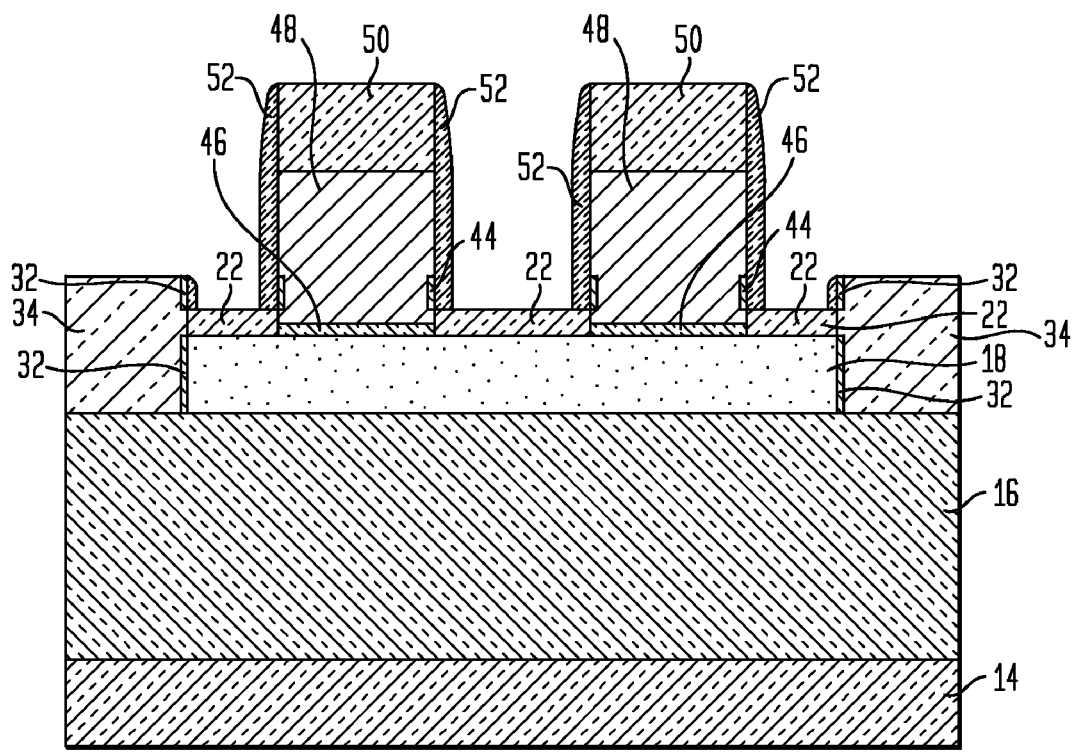
Figure 18A:
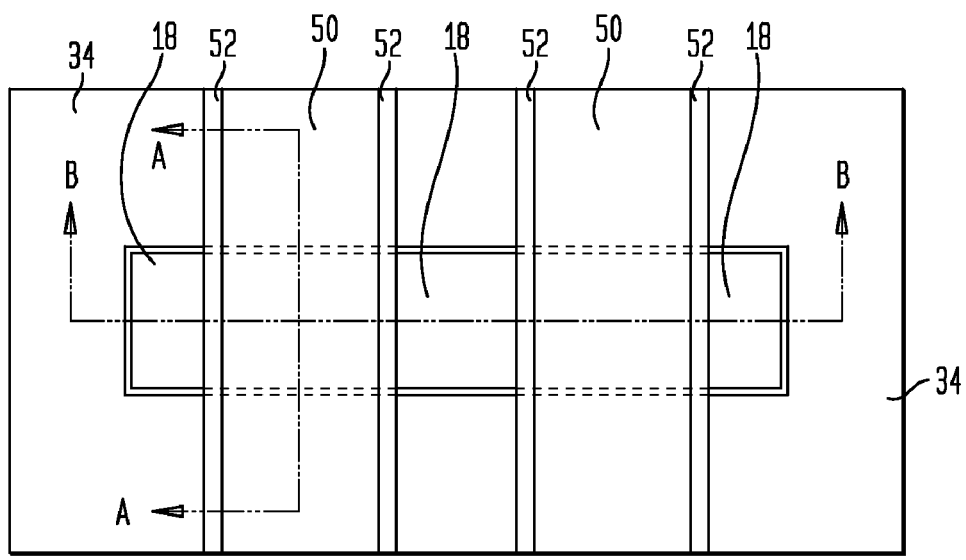
Figure 18B:
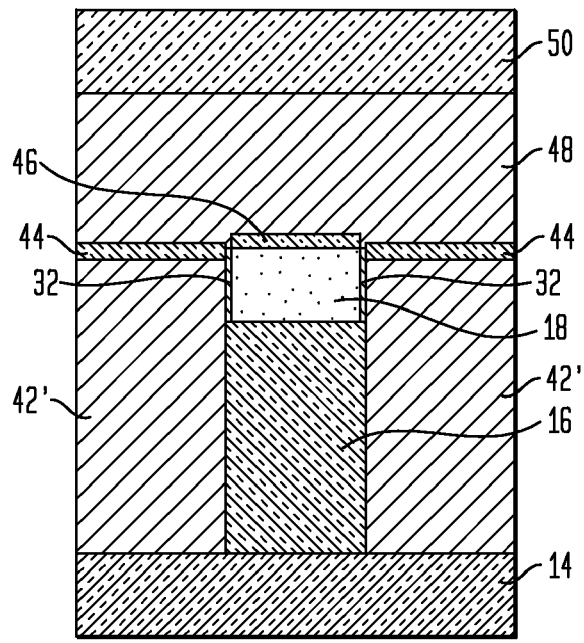
Figure 18C:
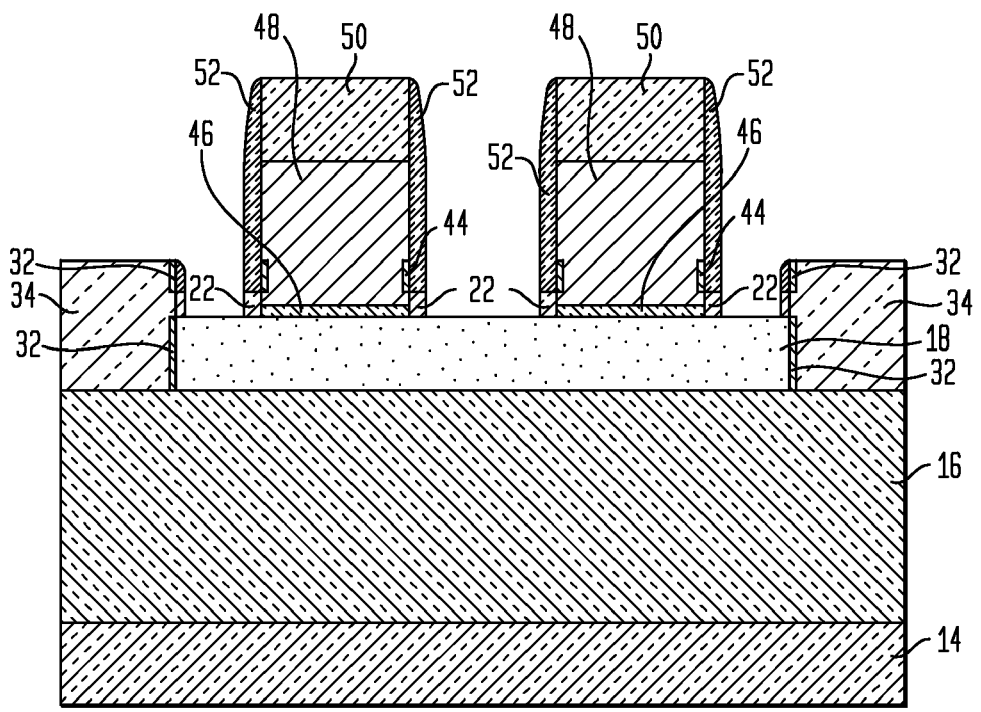

At this point of the inventive process, an oxide spacer 52 is formed on each sidewall of the wordline conductor 48. The purpose of the spacer 52 is to slightly widen the footprint of the wordline to avoid any possibility of etching into the seam between the wordline and the oxide layer 44 over the body capacitor plate 42' when the nitride layer 22 is subsequently removed. If the spacer 52 was not present at this time, there would be a remote possibility that the etch to remove the lower nitride layer 22 may damage the protective oxide layer 44 between the wordline 48 and the body capacitor plate 42'. The oxide spacer 52 is formed using well known methods such as deposition of a conformal CVD oxide film, followed by an anisotropic etch. FIGS. 17A-17C show the structure including the oxide spacer 52.

The exposed lower nitride layer 22 over active Si-containing layer 18 is then removed, for example, by reactive ion etching, stopping on the Si-containing layer 18 surface outside of the wordlines 48. The resultant structure in shown, for example, in FIGS. 18A-18C. A silicon nitride etch chemistry is typically employed to avoid erosion of the insulating material 34 and the insulating cap 50. Conventional processing follows, with formation of oxide spacers (if not previously formed), and source/drain implantation. Since the sidewall plates 42' and the source/drain diffusions 54 to be subsequently formed in the next processing step (See FIGS. 19A-19C) are each separately self-aligned with the wordline troughs 38, they are self-aligned with each other. The self-alignment of the sidewall plates 42' and the source/drain diffusions 54 is not taught or suggested in any prior art SOI body capacitor known to the applicants of the present invention.

Figure 19A:
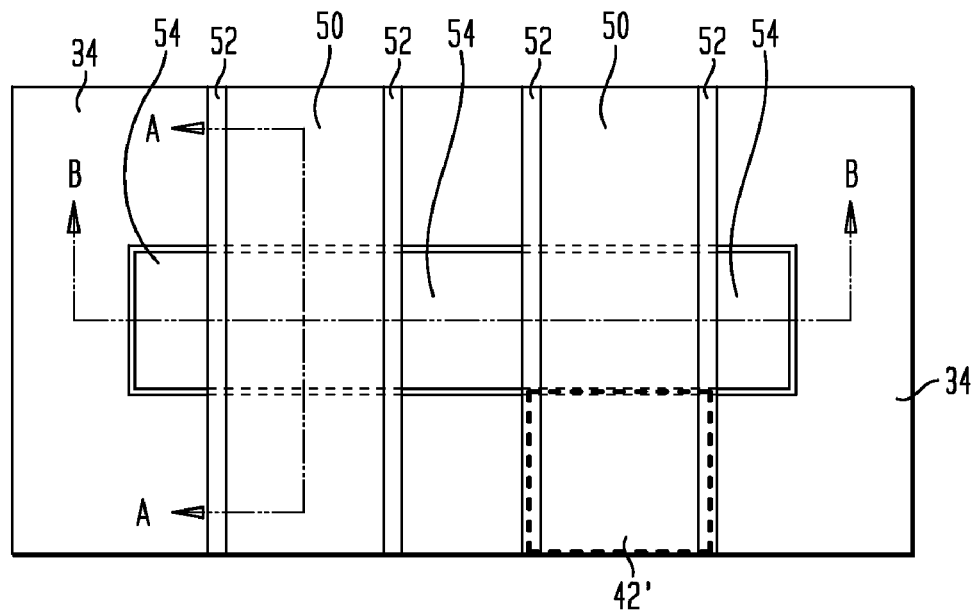
Figure 19B:
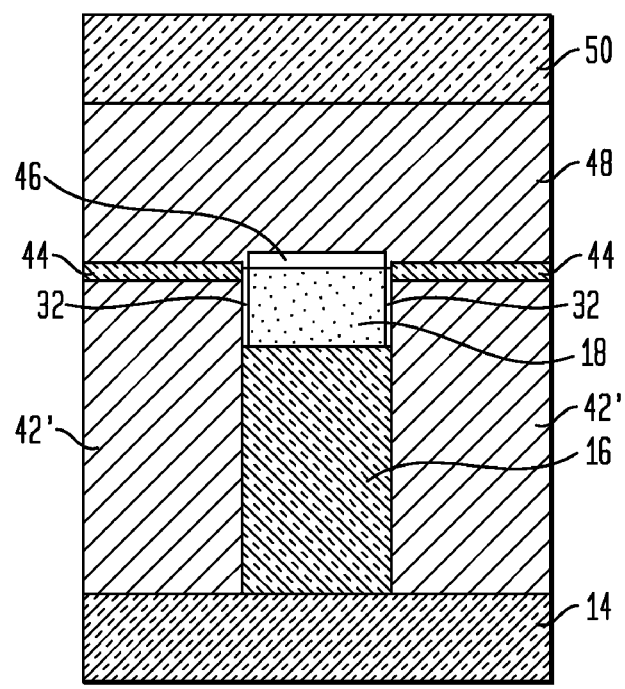
Figure 19C:
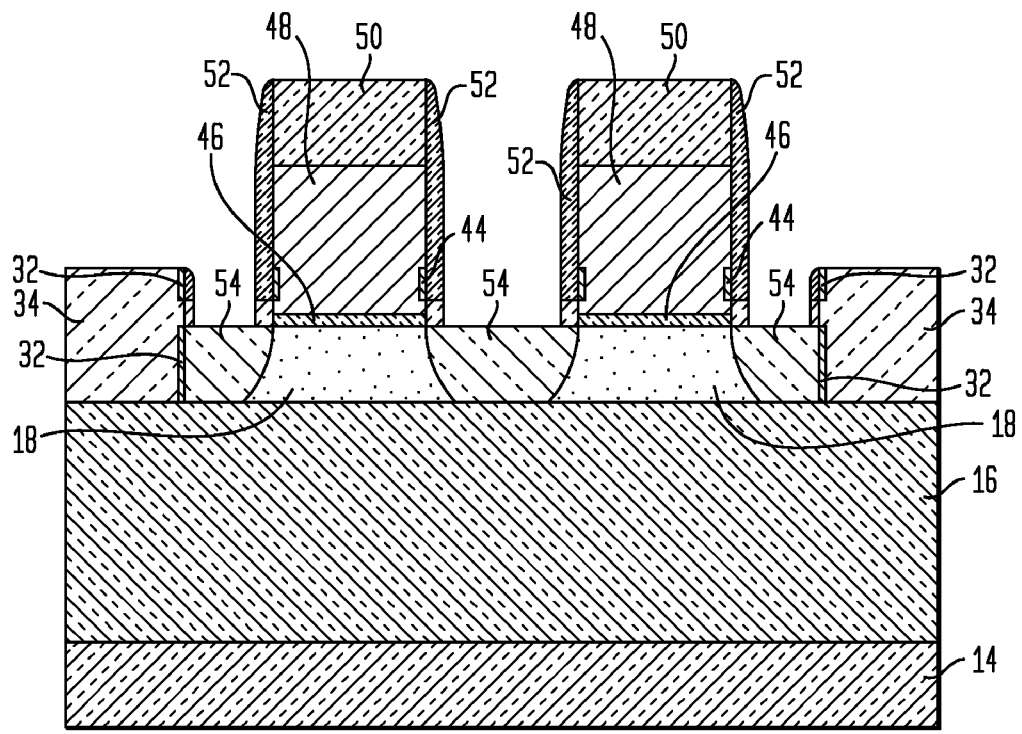
Figure 20A:
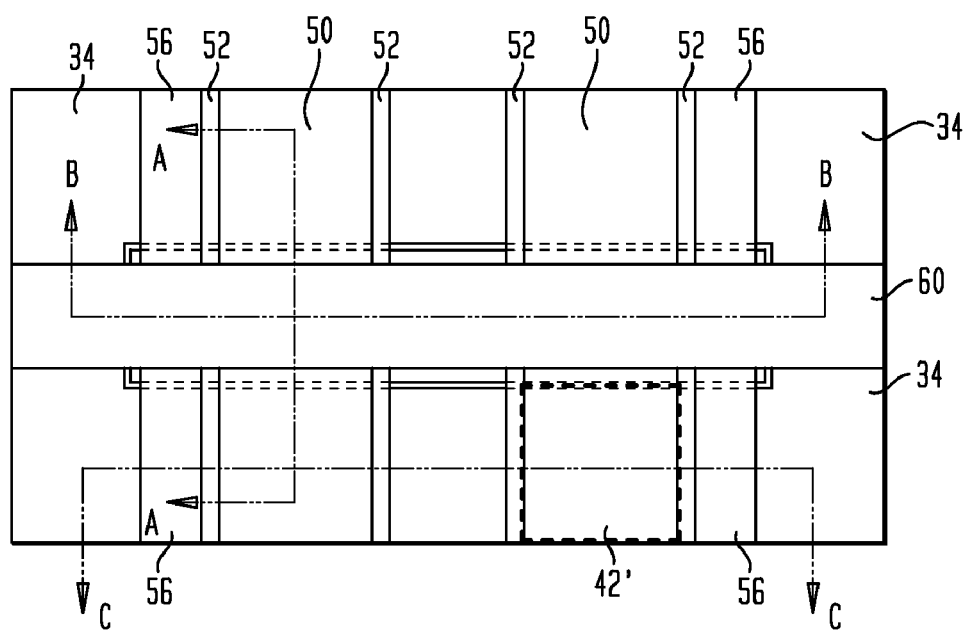
Figure 20B:
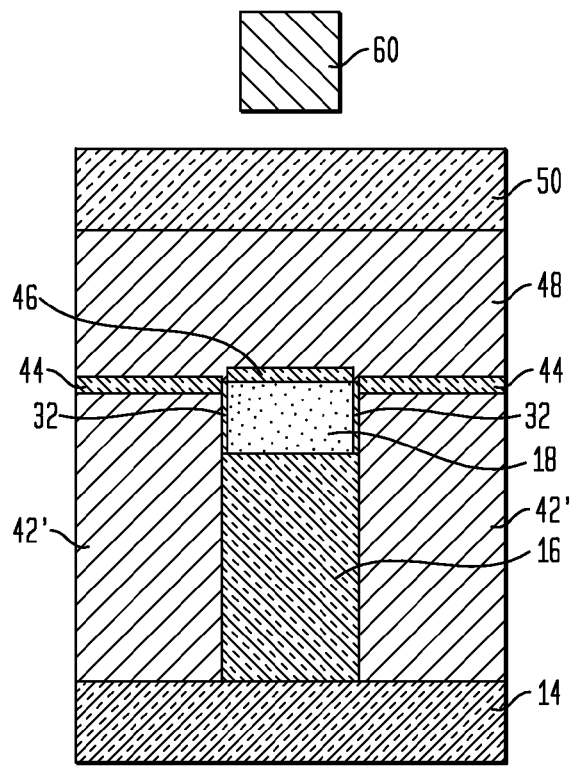
Figure 20C:
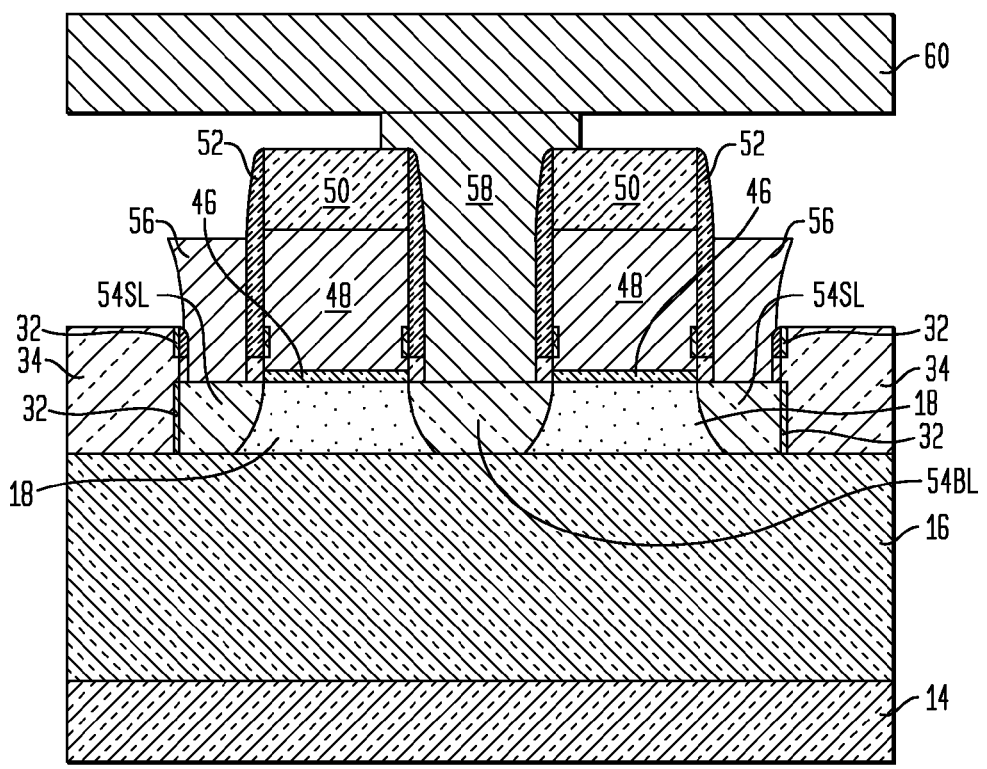
Figure 20D:
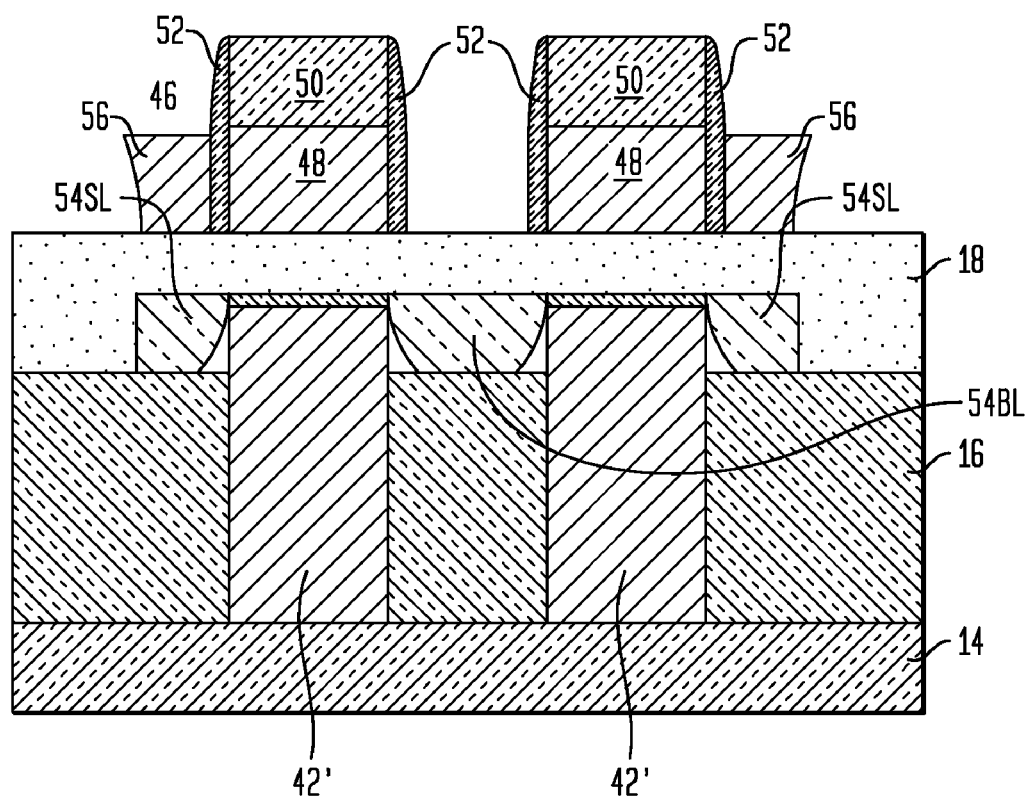

Source-drain implants (including any extensions and halos) and anneals are now done forming at least the source-drain diffusions 54 shown in FIGS. 19A-19C.

FIGS. 20A-20D exemplify a typical layout of a portion of the 1T-capacitorless memory array with self-aligned sidewall body plates 42'. Specifically, in FIGS. 20A-20D, a structure including two transistors that share a common bitline diffusion 54BL in the memory array is illustrated. The source line diffusion shown in these drawings are labeled as 54SL.

The structure shown in FIGS. 20A-20D includes sourceline (SL) conductors 56 that are formed adjacent to selected wordlines using well known metal deposition and damascene processes. An interlayer dielectric (ILD, not shown) is then typically deposited. Bitline studs 58 are formed to selected diffusions, and bitline conductors 60 are formed using standard methods. Higher level insulating and wiring layers are then formed to complete the fabrication of the chip. Several specific layouts and technology options for a memory array employing the self-aligned body-capacitor will be shown next. It is noted that in the present invention, the wordlines lie perpendicular to the bitlines and arrays of transistors are arranged in rows and columns.

Note that a new cross-section (C-C) has been added in FIG. 20. C-C is a cut parallel to B-B but passing through the capacitor plate 42' of the self-aligned body capacitor. A phantom of the SOI region (i.e., Si-containing layer 18) and source-drain diffusions 54 has also been incorporated into cross-sectional view C-C to illustrate the location of the capacitor plate 42' with respect to the diffusions 54 in the Si-containing layer 18, as well as the wordline conductor 48. It is emphasized that the edges of the capacitor plate 42', the wordline conductor 48, and the diffusions 54 are all self-aligned and are not subject to alignment tolerance.

Figure 21:
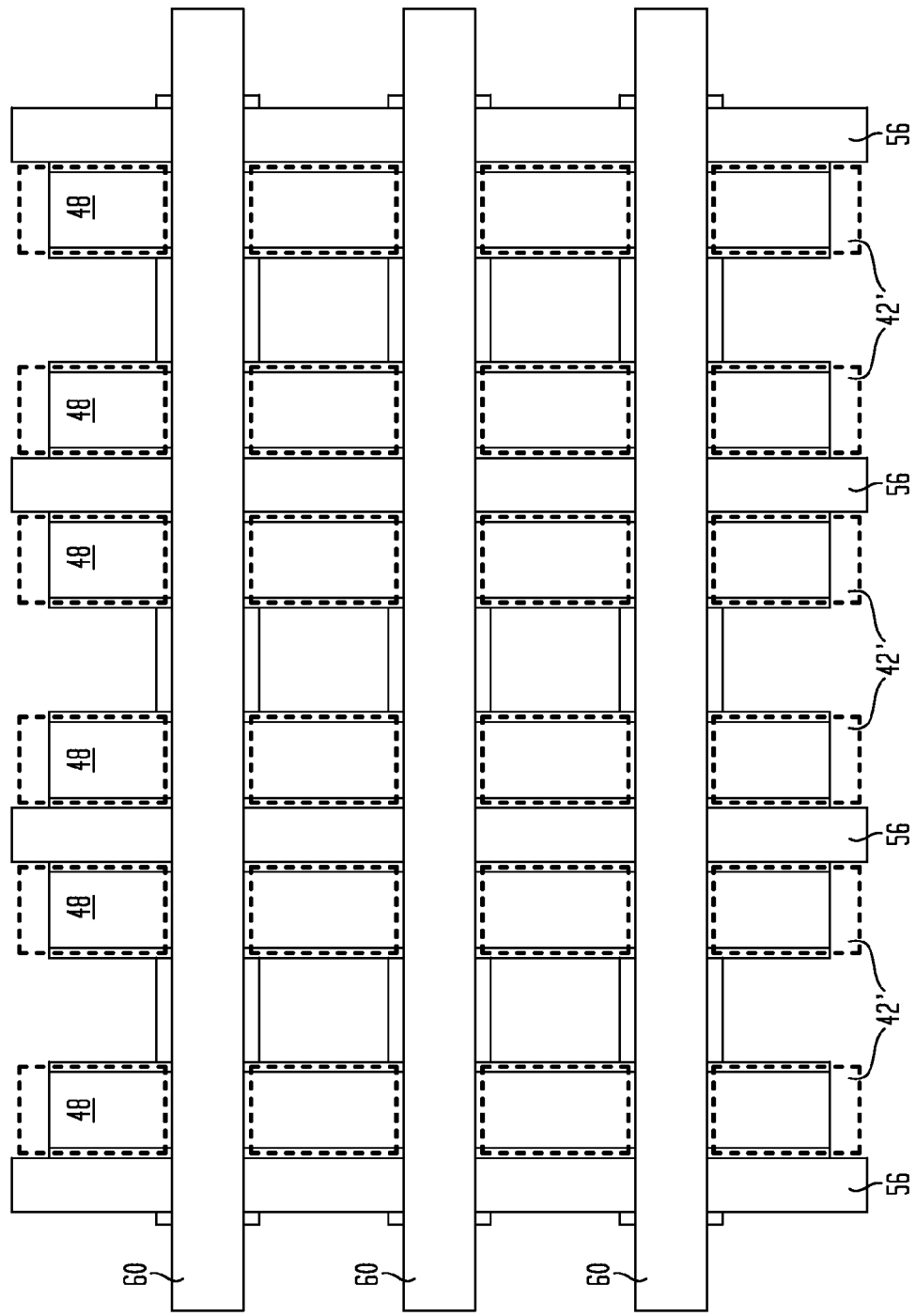
FIG. 21 is a first exemplary layout of a portion of an array cell employing the inventive self-aligned SOI body capacitor.

The above discussion, in reference to FIGS. 1-20, illustrates the various processing steps that are used in fabricating the inventive self-aligned SOI body capacitor structure shown in FIG. 20. FIGS. 21 and 22 illustrate some cell layouts that can include the inventive structure shown in FIG. 20. In FIGS. 21 and 22, like reference numerals are used to describe the components that are present in the structure shown in FIG. 20.

A first exemplary layout of a portion of an array of cells employing the inventive self-aligned SOI body capacitor illustrated in FIG. 20 is shown in FIG. 21. Specifically, FIG. 21 illustrates an open bitline architecture design where each wordline 48 gates a cell in each crossing bitline 60. Locations of the sidewall capacitor plate 42', self-aligned to the wordlines and diffusions, are delineated by the dashed line rectangular regions. This embodiment defines continuous stripes of SOI (running horizontally in FIG. 21). Rows of SOI stripes are separated by the inventive capacitor plate and regions of STI. Bodies of adjacent MOSFETs sharing the same SOI stripe are isolated by source-drain diffusions, which extend all the way to the BOX (as previously described by the process flow). If the technology were designed to use shallow source-drain diffusions that extend only partly to the BOX body charge of adjacent MOSFETs would not be isolated. In that case STI would be needed to provide isolation between bodies of MOSFETs sharing a common bitline. The case of source-drain diffusions extending partly to the BOX is discussed in FIG. 22.

Specifically, FIG. 22 illustrates a second exemplary layout of a portion of an array of cells employing the inventive self-aligned SOI body capacitor. In the folded bitline architecture design shown in FIG. 22, each wordline 48 gates a cell in alternate crossing bitlines. Locations of the sidewall capacitor plate, self-aligned to the wordlines and diffusions 60, are delineated by the dashed line rectangular regions. Regions of SOI (i.e., the active Si-containing layer 18) are indicated by rectangles bordered by dotted lines. These regions are labeled with reference numeral 100 in FIG. 22. A plurality of isolation regions (i.e., STIs) isolates SOI regions that lie under each bitline. Each one of the plurality of isolated SOI regions contains a single MOSFET with a single bitline contact diffusion on a first end and a single source line (SL) contact diffusion on a second end of said isolated SOI region. Corresponding SO regions in adjacent rows jog laterally by 1 minimum feature dimension (1F), thus resulting in the folded bitline layout. Since this second exemplary layout uses intervening STI to isolate bodies of MOSFETs sharing a common bitline, there is no restriction on the source-drain diffusion depth. No art has been found which illustrates a folded bitline layout for a body-charge storage type of memory device. All the known art for this type of cell employ continuous stripes of SO, thus necessitating deep diffusions. It may be advantageous to employ shallow diffusions for improved scalability.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure comprising:
   providing a structure that includes a patterned material stack located atop a patterned Si-containing layer, said patterned Si-containing layer is located on a buried insulating layer of a silicon-on-insulator substrate;
   forming a dielectric on exposed sidewalls of at least said patterned Si-containing layer;
   forming isolation regions on exposed areas of said buried insulating layer that lie adjacent to said patterned Si-containing layer;
   providing a recess in a portion of said isolation regions through said buried insulating layer and forming a sidewall capacitor plate in said recess;
   forming a plurality of transistors on said patterned Si-containing layer, each transistor comprising a wordline gate conductor and underlying source/drain diffusions; and
   forming a source line atop one of said diffusions and forming a bitline stud and a bitline atop said other diffusion, wherein said bitline stud separates a pair of adjacent wordline gate conductors, and said source/drain diffusions, said wordline gate conductor and said sidewall capacitor plate have edges that are aligned to each other.

2. The method of claim 1 wherein said providing said structure comprising forming a material stack comprising a lower nitride layer, a polysilicon layer, and an upper nitride layer on said silicon-on-insulator substrate, forming a resist on said material stack, subjecting said resist to lithography to provide a patterned resist on said material stack and etching exposed portions of said material stack not protected by said patterned resist.

3. The method of claim 2 wherein forming said isolation region comprises removing selective portions of said Si-containing layer, stopping on said buried insulating later, forming a dielectric in areas wherein said Si-containing layer was removed, and planarizing said dielectric to an upper surface of said patterned material stack.

4. The method of claim 2 wherein prior to forming said material stack the silicon-on-insulator substrate is subjected to an ion implantation process in which an implant region is formed at or near an interface between said buried insulating layer and a lower semiconductor layer.

5. The method of claim 1 wherein said providing said recess comprises forming a pad nitride layer on said structure, forming stripes in said pad nitride and selectively etching said portion of said isolation region.

6. The method of claim 1 wherein forming said sidewall capacitor plate comprises depositing a conductor into said recess, and recessing said conductor below a surface of said Si-containing layer.

7. The method of claim 6 wherein said recessing is aided by the presence of an oxide marker layer present in said patterned material stack.

8. The method of claim 1 wherein said forming said plurality of transistors includes opening selective portions of said patterned material stack to expose said patterned Si-containing layer; forming a transfer gate dielectric on said exposed patterned Si-containing layer; forming a wordline gate conductor on said transfer gate dielectric; recessing said wordline gate conductor and forming a dielectric cap atop said recessed wordline gate conductor.

9. The method of claim 8 further comprising opening the patterned material stack adjacent each transistor to expose other portions of said patterned Si-containing layer, and forming said diffusion regions into said exposed other portions of said patterned Si-containing layer.

10. The method of claim 9 wherein during said opening of said patterned material stack, oxide spacers are formed on said wordline gate conductor.

\* \* \* \* \*